United States Patent
Walther et al.

(10) Patent No.: US 10,575,101 B2
(45) Date of Patent: Feb. 25, 2020

(54) MICROELECTROMECHANICAL MICROPHONE

(71) Applicant: Infineon Technologies AG, Neubiberg (DE)

(72) Inventors: Arnaud Walther, Unterhaching (DE); Alfons Dehe, Villingen-Schwenning (DE); Gerhard Metzger-Brueckl, Geisenfeld (DE); Johann Strasser, Schierling (DE); Carsten Ahrens, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/897,946

(22) Filed: Feb. 15, 2018

(65) Prior Publication Data
US 2018/0234774 A1    Aug. 16, 2018

(30) Foreign Application Priority Data

Feb. 16, 2017 (DE) ................... 10 2017 103 195

(51) Int. Cl.
*H04R 19/04* (2006.01)
*B81B 3/00* (2006.01)
(Continued)

(52) U.S. Cl.
CPC ............. *H04R 19/04* (2013.01); *B81B 3/001* (2013.01); *B81B 3/0021* (2013.01);
(Continued)

(58) Field of Classification Search
CPC .... H04R 19/04; H04R 19/005; H04R 31/003; H04R 2201/003; B81B 3/001;
(Continued)

(56) References Cited

U.S. PATENT DOCUMENTS

| 6,075,867 A * | 6/2000 | Bay ................... H04R 19/04 381/191 |
| 7,912,236 B2 * | 3/2011 | Dehe ................ H04R 19/005 381/175 |

(Continued)

FOREIGN PATENT DOCUMENTS

| DE | 102013205527 A1 | 10/2013 |
| DE | 112011105850 T5 | 7/2014 |

(Continued)

*Primary Examiner* — Tuan D Nguyen
(74) *Attorney, Agent, or Firm* — Slater Matsil, LLP

(57) ABSTRACT

A microelectromechanical microphone includes a reference electrode, a first membrane arranged on a first side of the reference electrode and displaceable by sound to be detected, and a second membrane arranged on a second side of the reference electrode, said second side being situated opposite the first side of the reference electrode, and displaceable by sound to be detected. A region of one from the first and second membranes that is displaceable by sound relative to the reference electrode, independently of said region's position relative to the reference electrode, can comprise a planar section and also an undulatory section adjoining the planar section and arranged in a region of overlap one of the first membrane or the second membrane with the other one of the first membrane and or the second membrane.

24 Claims, 44 Drawing Sheets

(51) Int. Cl.
*B81C 1/00* (2006.01)
*H04R 31/00* (2006.01)
*H04R 19/00* (2006.01)

(52) U.S. Cl.
CPC ........ *B81B 3/0072* (2013.01); *B81C 1/00182* (2013.01); *H04R 19/005* (2013.01); *H04R 31/003* (2013.01); *B81B 2201/0257* (2013.01); *B81B 2203/0127* (2013.01); *B81B 2203/0163* (2013.01); *B81B 2203/04* (2013.01); *H04R 2201/003* (2013.01)

(58) Field of Classification Search
CPC ................ B81B 3/0072; B81B 3/0021; B81B 2203/0127; B81B 2203/04; B81B 2203/0163; B81B 2201/0257; B81C 1/00182
See application file for complete search history.

(56) References Cited

U.S. PATENT DOCUMENTS

| | | | |
|---|---|---|---|
| 2012/0148071 A1* | 6/2012 | Dehe | H04R 31/00 381/116 |
| 2012/0207332 A1* | 8/2012 | Dehe | H04R 1/403 381/182 |
| 2013/0221453 A1* | 8/2013 | Dehe | H04R 19/005 257/415 |
| 2013/0264663 A1* | 10/2013 | Dehe | H04R 19/005 257/416 |
| 2015/0256913 A1* | 9/2015 | Dehe | H04R 1/08 381/176 |

FOREIGN PATENT DOCUMENTS

| | | |
|---|---|---|
| DE | 102014212340 A1 | 1/2015 |
| DE | 102014216223 A1 | 3/2015 |
| DE | 102014116129 A1 | 5/2015 |

* cited by examiner

MICROELECTROMECHANICAL MICROPHONE

This application claims the benefit of German Application No. 102017103195.2, filed on Feb. 16, 2017, which application is hereby incorporated herein by reference in its entirety.

TECHNICAL FIELD

Various embodiments relate generally to a microelectromechanical microphone and to a method for producing a microelectromechanical microphone.

BACKGROUND

Microelectromechanical microphones have acquired great importance in modern communication. During the production of microelectromechanical microphones, a major challenge consists in producing their components with a well-defined shape and arranging them in a well-defined manner relative to one another. A major problem here results from intrinsic mechanical stresses to which the microphone components are subjected and which can lead to a deformation of said components, which in turn makes it more difficult to effect a well-defined relative positioning of the components of a microelectromechanical microphone.

Such stresses may have intrinsic causes and be attributable to thermal and mechanical loads during the production process. Alternatively or additionally, such stresses may arise only as a result of the coupling of different components, for example as a result of the coupling of a plurality of components having mutually different coefficients of thermal expansion.

In order to produce a microelectromechanical microphone having reproducible properties, it is therefore necessary to compensate for the mechanical stresses to which the components of said microphone are subjected.

SUMMARY

In accordance with various embodiments, a microelectromechanical microphone is provided which can comprise: a reference electrode, a first membrane arranged on a first side of the reference electrode and displaceable by sound to be detected, and a second membrane arranged on a second side of the reference electrode, said second side being situated opposite the first side of the reference electrode, and displaceable by sound to be detected. A region of one from the first and second membranes that is displaceable by sound relative to the reference electrode, independently of said region's position relative to the reference electrode, can comprise a planar section and also an undulatory section adjoining the planar section and arranged in a region of overlap of the one membrane with the other from the first and second membranes.

In accordance with various embodiments, a method for producing a microelectromechanical microphone includes forming a first membrane, and forming a reference electrode on the first membrane. Forming the first membrane includes producing a first negative mold for the first membrane, wherein the first negative mold for the first membrane includes a first section complementary to a planar section of a region of the first membrane that is displaceable by sound, and a second section complementary to an undulatory section of the region of the first membrane that is displaceable by sound, wherein producing the first negative mold includes depositing a membrane material onto the first negative mold to form the first membrane, and removing the first negative mold, wherein the first membrane is exposed when removing the first negative mold.

BRIEF DESCRIPTION OF THE DRAWINGS

Various embodiments will be described in greater detail below by reference to the accompanying drawings, in which.

DETAILED DESCRIPTION OF ILLUSTRATIVE EMBODIMENTS

Figure 1A:
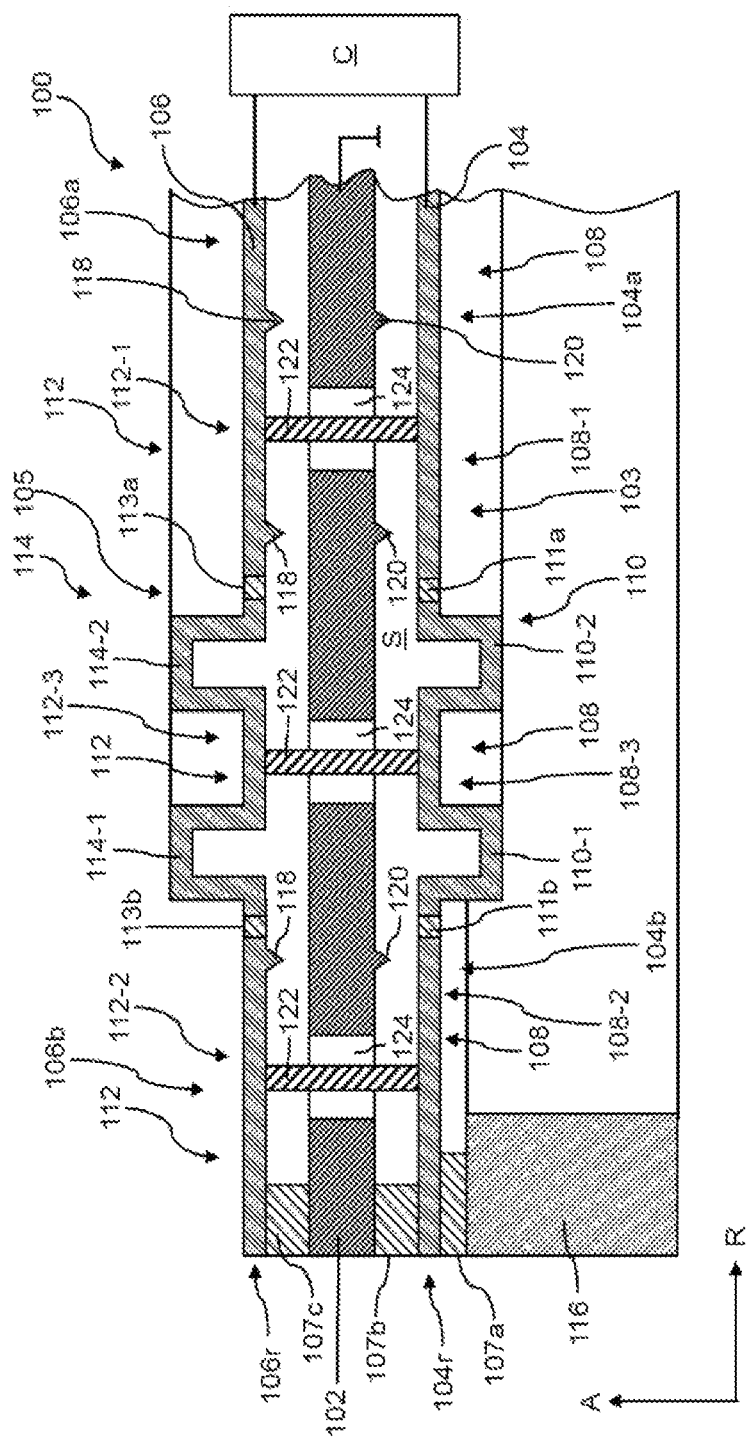
FIGS. 1a and 1b show schematic cross-sectional views of exemplary microelectromechanical microphones.

The term "exemplary" is used here to mean "serving as an example, as an exemplar or for illustration". Any embodiment or configuration described here as "exemplary" should not necessarily be understood as preferred or advantageous vis-à-vis other embodiments or configurations.

The term "planar" denotes the geometry of a component or of a component section which has a significantly larger extent in a first direction and in a second direction, orthogonal to the first direction, compared with a third direction (thickness direction), orthogonal to the first and second directions.

In the drawings, identical reference signs refer to the same parts in the different views. The drawings serve primarily to illustrate the essential principles of the present disclosure and are therefore not necessarily true to scale.

FIG. 1a shows one exemplary microelectromechanical microphone 100, which can comprise: a reference electrode 102, a first membrane 104 arranged on a first side of the reference electrode 102 and displaceable by sound to be detected, and a second membrane 106 arranged on a second side of the reference electrode 102, said second side being situated opposite the first side of the reference electrode 102, and displaceable by sound to be detected.

A region 103 of the first membrane 104 that is displaceable relative to the reference electrode 102, independently of said region's position relative to the reference electrode 102, can comprise a planar section 108 and also an undulatory (e.g. grooved) section 110 adjoining the planar section 108 and arranged in a region of overlap of the first membrane 104 with the second membrane 106. A region 105 of the second membrane 106 that is displaceable relative to the reference electrode 102, independently of said region's position relative to the reference electrode 102, can also comprise a planar section 112 and also an undulatory (e.g. grooved) section 114 adjoining the planar section 112 and arranged in a region of overlap of the second membrane 106 with the first membrane 104. That means, in particular, that the first and second membranes 104, 106, in a respective neutral position in which they are not deflected, can comprise the planar section 108 and 112, respectively, and also the undulatory section 110 and 114, respectively. The region 103, 105 of the first and second membranes 104, 106, respectively, that is displaceable by sound relative to the reference electrode 102 can be a region which is not in permanent physical contact with another structural part.

The first and second membranes 104, 106 in a respective edge region 104r and 106r, can be secured to a holder 116, for example by interposition of respective supporting elements 107a-c. The region 103, 105 of the first and second membranes 104, 106, respectively, that is displaceable by sound can be in particular a region of the first and second membranes 104, 106, respectively, that is different from the respective edge regions 104r, 106r.

The holder 116 can be produced for example from a semiconductor material, for example crystalline silicon. The supporting elements 107a-c can be formed from an electrically insulating material, for example SiOx or/and SixNy. As indicated in FIG. 1a, the holder 116 and also the supporting elements 107a-c can each have a ring-segment-shaped or ring-shaped configuration.

The first membrane 104, the second membrane 106 and the reference electrode 102 can have diameters of less than 1 mm, optionally less than 750 μm, and further optionally less than 100 μm.

The first membrane 104, the second membrane 106 and the reference electrode 102 can be produced at least in sections or even completely from an electrically conductive material, such as, for instance, from a polycrystalline semiconductor material, for example silicon, or from a metal.

An electrically conductive material can be a material having an electrical conductivity of more than 10 S/m, e.g. more than 102 S/m or more than 104 S/m or even more than 106 S/m. An electrically insulating material can be a material having an electrical conductivity of less than 10-2 S/m, e.g. less than 10-5 S/m or even less than 10-7 S/m.

The microphone 100 can be read for example capacitively by a control unit C for example by a first electrical signal, which represents a change—caused by sound—in a first capacitance between the reference electrode 102 and the first membrane 104, or/and for example by a second electrical signal, which represents a change—caused by sound—in a second capacitance between the reference electrode 102 and the second membrane 106, being determined or read out by the control unit C. For this purpose, by way of example, a reference voltage can be applied to the reference electrode 102 and respective operating voltages that are different from the reference voltage can be applied to the first and second membranes 104, 106 by the control unit C and an electric current caused by the change in the first and second capacitances can be measured by the control unit C and the sound pressure can be determined from said electric current. A change in the first or/and in the second capacitance is caused by a displacement of the first and/or second membrane 104, 106 relative to the reference electrode 102.

The first and second membranes 104, 106 can be electrically insulated from one another, optionally in each of their positions relative to the reference electrode 102. This configuration affords the possibility of applying mutually different electrical operating voltages to the membranes 104, 106 and of reading out a first electrical signal, characterizing a change in a first capacitance between the first membrane 104 and the reference electrode 102, separately from a second electrical signal, characterizing a change in a second capacitance between the second membrane 106 and the reference electrode 102. In this configuration, the reference voltage applied to the reference electrode 102 constitutes a common reference voltage for both membranes 104, 106. The reference electrode 102 here can be formed completely from an electrically conductive material. In one exemplary embodiment, the operating voltages to be applied to the membranes 104, 106 can have the same magnitude, but opposite signs, in relation to the reference voltage. As a result, the first and second electrical signals can be combined with one another, for instance subtracted from one another or added together, in order for example to reduce or eliminate common noise contributions. As a result, a differential measurement scheme can be realized, as a result of which a precise measurement of properties of the sound to be detected, such as the sound pressure, for instance, is made possible.

In the case of this construction, the sensitivity of the microphone 100 can be influenced by parasitic capacitances which can be caused for example by parts of the membranes 104, 106 which are not displaceable relative to the reference electrode 102, for instance the edge regions 104r, 106r of the first and second membranes 104, 106, respectively. These parts of the membranes 104, 106 do not yield a useful signal contribution since they are not displaceable relative to the reference electrode 102, but they yield a contribution to the total capacitance if, for instance, the first and second membranes 104, 106 are formed completely from an electrically conductive material and the respective edge regions 104r, 106r therefore also define a capacitor.

In order to reduce the parasitic capacitance caused by said parts of the first or/and second membrane 104, 106, as shown in FIG. 1a, the first membrane 104 can comprise a dynamic section 104a contained at least partly, optionally completely, in its region 103 displaceable by sound, said dynamic section being electrically insulated from a remaining region 104b of the first membrane 104 by an insulation section 111a or/and 111b. Alternatively or additionally, the second membrane 106 can comprise a dynamic section 106a contained at least partly, optionally completely, in its region 105 displaceable by sound, said dynamic section being electrically insulated from a remaining region 106b of the second membrane 106 by an insulation section 113a or/and 113b.

As shown in FIG. 1a, the remaining region 104b of the first membrane 104 can comprise the abovementioned edge region 104r as a securing section connected to the holder 116. Alternatively or additionally, as shown in FIG. 1a, the remaining region 106b of the second membrane 106 can comprise the abovementioned edge region 106r as the securing section connected to the holder 116.

As indicated in FIG. 1a, an insulation section 111a of the first membrane 104 can be arranged at least partly, optionally completely, on a side of the undulatory section 110 of the first membrane 104 that faces away from the securing section 104r of the first membrane 104. Alternatively or additionally, as likewise shown in FIG. 1a, an insulation section 111b of the first membrane 104 can be provided on a side of the undulatory section 110 of the first membrane 104 that faces the securing section 104r. The insulation section 111a and/or 111b can be embodied in a ring-shaped fashion, such that the dynamic section 104a of the first membrane 104 is entirely surrounded by the remaining section 104b of the first membrane 104 in a plane of the first membrane 104.

As can likewise be seen in FIG. 1a, an insulation section 111a of the second membrane 106 can be arranged at least partly, optionally completely, on a side of the undulatory section 114 of the second membrane 106 that faces away from the securing section 106r of the second membrane 106. Alternatively or additionally, as likewise shown in FIG. 1a, an insulation section 113b of the second membrane 106 can be provided on a side of the undulatory section 114 of the second membrane 106 that faces the securing section 106r. The insulation section 113a or/and 113b can be embodied in a ring-shaped fashion, such that the dynamic section 106a of the second membrane 106 is entirely surrounded by the remaining section 106b of the second membrane 106 in a plane of the second membrane 106.

By providing an insulation section 111a, 113a on a side of the undulatory section 110 of the first membrane 104 and of the undulatory section 114 of the second membrane 106, respectively, that faces away from a securing section 104r, 106r, it is possible to reduce an influencing of an electric field between the membranes 104, 106 by the respective undulatory sections 110, 114, for instance by reading out only electrical signals from the dynamic sections 104a, 106a of the regions 103, 106 displaceable by sound for the purpose of sound detection.

By providing an insulation section 111b, 113b on a side of the undulatory section 110 of the first membrane 104 and of the undulatory section 114 of the second membrane 106, respectively, that faces a securing section 104r, 106r, it is possible to reduce or prevent mechanical loads on the dynamic sections 104a, 106a of the first and of the second membrane 104, 106, respectively, said mechanical loads resulting from mechanical stresses in the insulation sections 111b, 113b, by virtue of the undulatory sections 110 and 114, as a result of which it is possible in turn to provide for a defined electric field between the first and second membranes 104, 106.

The insulation sections 111a, 111b, 113a, 113b can be formed from an electrically insulating material, for example from an oxide, such as SiOx, for instance, or a nitride, for instance SixNy.

Figure 1B:
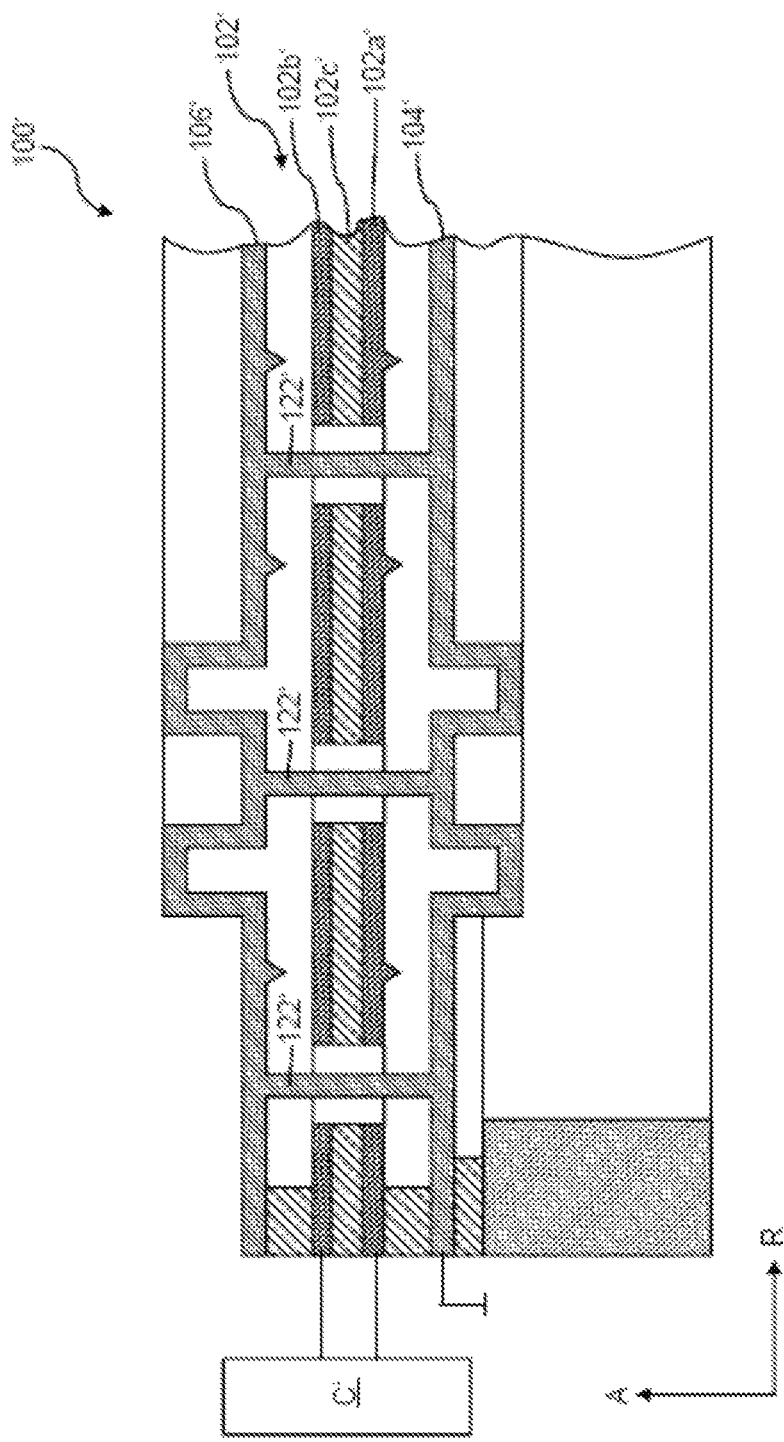

FIG. 1b illustrates a microphone 100' that is modified relative to the microphone 100 shown in FIG. 1a. The microphone 100' shown in FIG. 1b differs from the microphone 100 in that the first and second membranes 104', 106' are electrically connected to one another, optionally in each of their positions relative to the reference electrode 102'. In addition, the reference electrode 102' comprises a layer structure having an electrically conductive first reference electrode layer 102a', which faces the first membrane 104', and an electrically conductive second reference electrode layer 102b', which faces the second membrane 106'. The first and second reference electrode layer 102a', 102b' are separated from one another by an electrically insulating third reference electrode layer 102c'. The first and second reference electrode layers 102a' and 102b' can be formed from a metal or a polycrystalline semiconductor material, for instance silicon. The third reference electrode layer 102c' can be formed for example from an oxide, for instance SiOx, or a nitride, for instance SixNy.

In the case of the microphone 100' shown in FIG. 1b, by means of a control unit C', a uniform operating voltage can be applied to the first and second membranes 104', 106', while mutually different reference voltages can be applied to the reference electrode 102' or to the first and second reference electrode layers 102a', 102b', for example reference voltages having the same magnitude but opposite signs in relation to the operating voltage. Consequently, in the case of the microphone 100' shown in FIG. 1b, too, it is possible to determine two mutually different electrical signals which can be combined by addition or subtraction in order to eliminate or to reduce common noise contributions. That means that a differential measurement scheme can be realized with the configuration shown in FIG. 1b, too.

Even though this is not shown in FIG. 1b, it is also possible, of course, for dynamic sections to be defined in the first and/or the second membrane 104', 106' by means of respective insulation sections, said dynamic sections being electrically insulated from remaining regions of the first or/and the second membrane 104', 106'.

Figure 1C:
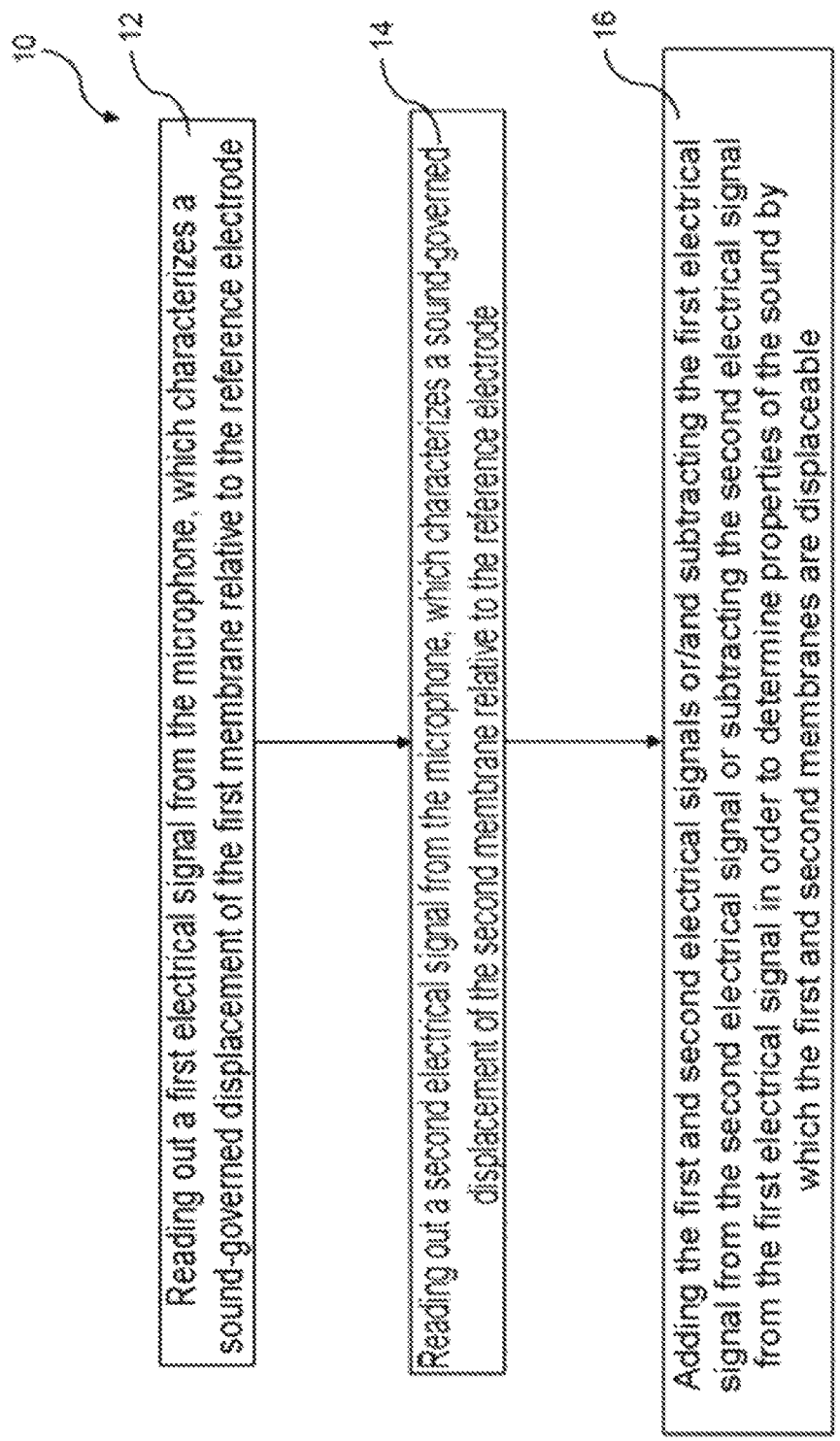
FIG. 1c shows a flow diagram of one exemplary method for operating a microelectromechanical microphone.

FIG. 1c shows a flow diagram of one exemplary method 10 for operating a microphone 100, 100' described above: the method 10 can comprise:

reading out a first electrical signal from the microphone 100, 100', which characterizes a sound-governed displacement of the first membrane 104, 104' relative to the reference electrode 102, 102' (12), reading out a second electrical signal from the microphone 100, 100', which characterizes a sound-governed displacement of the second membrane 106, 106' relative to the reference electrode 102, 102' (14), and adding the first and second electrical signals or/and subtracting a first electrical signal from the second electrical signal or subtracting the second electrical signal from the first electrical signal in order to determine properties of the sound by which the first membrane 104, 104' and the second membrane 106, 106' are displaceable (16).

Reading out the first and second electrical signals can be carried out for example by the control units C and C' shown in FIGS. 1a and 1b, respectively. Said control units can also be configured to combine the first and second electrical signals with one another by addition or/and subtraction. The control units C, C' can be implemented for example as an application-specific integrated circuit (ASIC). If a membrane 104, 106, as shown in FIG. 1a, comprises a dynamic section 104a and 106a, respectively, the control unit C can be electrically connected thereto in order to read out a first or respectively a second electrical signal only from this section, as a result of which, as described above, the influence of parasitic capacitances on the determination of sound properties can be reduced.

For the description of common features of the microphones 100 and 100', reference is made below only to the microphone 100, while reference is made to the microphone 100' only to elucidate differences between the microphones 100 and 100'.

For a precise measurement of sound properties, a reproducible displacement of the first or/and of the second membrane 104, 106 relative to the reference electrode 102 is necessary in order that an unambiguous relationship exists between a position of the first or/and the second membrane 104, 106 relative to the reference electrode 102 and a specific sound pressure. Such a relationship can be adversely affected by deformations of the first or/and of the second membrane 104, 106 relative to the reference electrode 102 which are not attributable to sound to be detected. As mentioned initially, said deformations can be caused by thermal or mechanical loads during the production of the first or/and of the second membrane 104, 106 or by thermal deformations during operation of the microphone 100. Thermally governed deformations of the first or/and of the second membrane 104, 106 during the operation of the microphone 100 can be caused for example by mutually different coefficients of thermal expansion of the first or/and of the second membrane 104, 106, on the one hand, and of the holder 116 or/and of the supporting elements 107a-c, on the other hand.

By means of the undulatory sections 110, 114 of the first and second membranes 104, 106, respectively, deformations of the first and second membranes 104, 106, respectively, which are caused by such mechanical stresses can be compensated for since the respectively undulatory sections no, 114 can act as spring elements, as a result of which they can compensate for said stresses. As a result, an unambiguous relationship exists between a position of the first and second membranes 104, 106 relative to the reference electrode 102 and a specific sound pressure, as a result of which a precise measurement of a sound pressure becomes possible.

By virtue of the fact that the undulatory section 110 of the first membrane 104 is provided in a region of the first membrane 104 that overlaps the second membrane 106 and that the undulatory section 114 of the second membrane 106 is provided in a region of the second membrane 106 that overlaps the first membrane 104, it is possible to ensure that it is possible to compensate for mechanical stresses in the membranes 104, 106 by virtue of the respective undulatory sections 110, 114 independently of the respective other membrane 104, 106. As a result, mechanical stresses in the membranes 104, 106 can be compensated for more precisely in comparison for example with a microphone in which the membranes are connected by a common connection section to a holder which comprises a spring element embodied as an undulatory section.

As indicated in FIG. 1a, the undulatory section 110, 114 of the first and second membranes 104, 106, respectively, can be delimited on all sides by the planar section 108, 112 of the region 103, 105 of the first and second membranes 104, 106, respectively, that is displaceable by sound. It is thereby possible to ensure that, by means of the undulatory section 110, 114, it is possible to take up mechanical stresses from a large region of the first and second membranes 104, 106, respectively, since, by virtue of this configuration, the undulatory section 110, 114 with each side thereof adjoining the planar section 108, 112 can take up mechanical stresses in the relevant membrane 104, 106.

In the exemplary microphone 100 shown in FIG. 1a, the undulatory section 110, 114 of the first and second membranes 104, 106, respectively, can have a ring-segment-like or ring-shaped configuration. It is thereby possible to compensate for mechanical stresses independently of their direction in the plane of the first and second membranes 104, 106, respectively. As indicated in FIG. 1a, the undulatory sections no, 114 can subdivide the planar sections 108, 112 of the regions 103, 105 of the first and second membranes 104, 106, respectively, that are displaceable by sound into a radially inner region 108-1 and 112 1, respectively, and into a radially outer region 108-2 and 112-2, respectively. It is thereby possible to provide undulatory sections no, 114 which, in conjunction with a construction that is simple overall, are surrounded on all sides by the planar sections 108 and 112, respectively, or adjoin the latter. The radial and axial directions are indicated by the reference signs R and A, respectively, in FIG. 1a.

The undulatory section 110 of the first membrane 104 or/and the undulatory section 114 of the second membrane 106 can each comprise at least one hollow projection 110-1, 110-2 or/and 114-1, 114-2, respectively, protruding from the respective planar section 108 or/and 112. In the exemplary microphone 100 shown in FIG. 1a, the undulatory section 110 of the first membrane 104 can comprise for example two hollow projections 110-1, 110-2 protruding from the planar section 108, which each protrude in a direction facing away from the reference electrode 102. The undulatory section 114 of the second membrane, too, can comprise for example two hollow projections 114-1, 114-2 protruding from the planar section 112 of the region 105 of the second membrane 106 that is displaceable by sound, which protrude in a direction facing away from the reference electrode 102. The hollow projections 110-1, 110-2 of the first membrane 104 can be arranged opposite the hollow projections 114-1, 114-2 of the second membrane 106. As likewise shown in FIG. 1a, the hollow projections 110-1, 110-2 and 114-1, 114-2 can each have a rectangular, for example square, cross section. The hollow projections 110-1, 110-2 and 114-1, 114-2 can be connected to one another by a respective interconnection region 108-3 and 112-3 of the planar sections 108 and 112, respectively. It goes without saying that the number of hollow projections 110-1, 110-2 of the undulatory section 110 of the first membrane 104 and the number of hollow projections 114-1, 114-2 of the undulatory section 114 of the second membrane 106 are not restricted to two, but rather can be altered depending on the concrete configuration of the microelectromechanical microphone 100.

The configuration of the undulatory sections 110, 114 having hollow projections 110-1, 110-2, 114-1, 114-2, in particular having a rectangular cross section, constitutes a construction that is simple overall. Moreover, mechanical stresses occurring in the plane of the planar sections 108 and 112, respectively, can be taken up effectively as a result. The opposite arrangement of the respective hollow projections 110-1, 110-2 and 114-1, 114-2 makes it possible to compensate for stresses in the first and second membranes 104, 106 in a similar manner, such that it is thereby possible to ensure a symmetrical arrangement of the first and second membranes 104, 106 relative to the reference electrode 102.

As furthermore shown in FIG. 1a, the second membrane 106 can comprise a plurality of membrane anti-stick projections 118 facing the reference electrode 102. It is thereby possible to prevent the second membrane 106 from sticking to the reference electrode 102 in the case of large deflections of the second membrane 106 in the direction of the reference electrode 102, since even in the case of a physical contact between the reference electrode 102 and the second membrane 106 the area of contact is very small. At least one membrane anti-stick projection 118 or even all the membrane anti-stick projections 118 can have a shape that tapers in the direction of the reference electrode 102. It is thereby possible to minimize an area of contact between the reference electrode 102 and the second membrane 106 in the case of a physical contact.

As likewise shown in FIG. 1a, the reference electrode 102 can comprise a plurality of electrode anti-stick projections 120 facing the first membrane 104. Said anti-stick projections can have a shape that tapers in the direction of the first membrane 104.

In the case of the exemplary microphone 100 shown in FIG. 1a, the first membrane 104 can thus be prevented from sticking to the reference electrode 102 by means of the electrode anti-stick projections 120 provided on the reference electrode 102. The second membrane 106 can be prevented from sticking to the reference electrode 102 by means of the membrane anti-stick projections 118 provided on the second membrane 106. However, the provision of anti-stick projections in accordance with FIG. 1a is not mandatory, of course. In this regard, by way of example, anti-stick projections may be provided only on the areas of the reference electrode 102 which face the first and/or second membrane 104, 106. In such a configuration, anti-stick projections on the first and second membrane 104, 106 can be entirely dispensed with.

Alternatively, anti-stick projections may be provided only on the respective sides of the first and second membranes 104, 106 that face the reference electrode 102. In such a configuration, anti-stick projections on the reference electrode 102 can be entirely dispensed with.

The exemplary microphone 100 shown in FIG. 1a can furthermore comprise a plurality of spacers 122 arranged between the first and second membranes 104, 106 and configured to maintain a predefined distance between the first and second membranes 104, 106, wherein the reference electrode 102 can comprise a plurality of through openings 124 through which a respective spacer 122 extends. The provision of the spacers 122 extending through the through openings 124 affords the possibility, in principle, of providing a spacer 122 in a region that is different from an edge region 104r, 106r of the first and second membranes 104, 106, respectively, in order thereby to be able to set a well-defined distance between the membranes 104, 106 for example in a central region of the first or/and of the second membrane 104, 106. If, as shown in FIG. 1a, a plurality of spacers 122 is provided, a close-meshed spacer arrangement can be provided which can be used to set the distance between the first and second membranes 104, 106 accurately over the entire extent of the first and second membranes 104, 106. The spacers 122 together with the undulatory sections 110, 114 can thus ensure a defined position of the first and second membranes 104, 106 relative to the reference electrode 102. The distances between adjacent spacers 122 can be approximately 10 to 100 µm, for example 25 to 75 µm, such as, for instance, 40 to 60 µm.

At least one spacer 122, a plurality of the spacers 122 or even all the spacers 122 can be produced at least in sections, optionally completely, from an electrically insulating material, for instance from SiOx or SixNy. This configuration is suitable for example if the first and second membranes 104, 106 are electrically insulated from one another. In this case, provision can also be made for forming at least one spacer 122, a plurality of the spacers 122 or even all spacers 122 from a combination of an electrically insulating material with an electrically conductive material, for instance a metal or a polycrystalline semiconductor material, e.g. polycrystalline silicon, as a result of which the capacitive coupling between the first and second membranes 104, 106 is able to be reduced, which coupling may otherwise be problematic since the first and second membranes 104, 106 may be at different electrical potentials.

At least one of the spacers 122, optionally a plurality of the spacers 122, further optionally all spacers 122, can be in permanent physical contact with the first or/and the second membrane 104, 106. As a result, the distance between the first and second membranes 104, 106 can be kept constant independently of whether stresses occurring in the first or the second membrane 104, 106 lead to a tensile or compressive loading.

In one exemplary embodiment, for example in the case of the microphone 100' shown in FIG. 1b, at least one spacer 122', a plurality of the spacers 122' or even each spacer 122', optionally completely, can be formed from an electrically conductive material, for example from a metal or from a polycrystalline semiconductor material, such as silicon, for instance, in order to be able to provide an electrical contact between the first membrane 104' and the second membrane 106'. As a result, the spacers 122' can be used both for ensuring a defined distance between the membranes 104', 106' and for providing an electrical contact between the membranes 104', 106', which contributes to a construction that is compact overall since the spacers 122' can perform a plurality of functions. As indicated in FIG. 1b, at least one spacer 122', optionally a plurality of spacers 122', further optionally each spacer 122', can be embodied integrally with the first or/and the second membrane 104', 106'.

As shown in FIG. 1a, at least one spacer 122 can be connected to a planar section 108, 112 of the region 103, 105 of the first or/and of the second membrane 104, 106 that is displaceable by sound. In this case, the construction can be such that at least one spacer 122 is connected to the respective radially inner regions 108-1, 112-1 of the planar sections 108 and 112, respectively, or/and that at least one spacer 122 is connected to the respective radially outer regions 108-2, 112-2 of the planar sections 108 and 112, respectively, or/and that at least one spacer is connected to the respective interconnection regions 108-3, 112-3 of the planar sections 108 and 112, respectively. This configuration makes it possible here to produce reference points between which the respective hollow projections 110-1, 110-2, 114-1, 114-2 are arranged, which as a result can locally ensure a compensation of mechanical stresses.

In order not to adversely affect the displaceability of the membranes 104, 106, provision can be made, as indicated in FIG. 1a, for at least one spacer 122, a plurality of the spacers 122 or even all spacers 122 to extend without contact through the respective through openings 124. In one exemplary embodiment, the first or/and the second membrane 104, 106 is/are in contact with the spacers 122 in none of its/their positions. As a result, it is possible to ensure a high linearity of the microphone response to sound waves to be detected.

The diameter of a spacer 122 can be approximately 1 to 5 µm. The diameter of a through opening 124 can be larger by 10% to 100%, optionally by 25% to 75%, further optionally by 40% to 60%, than the diameter of a spacer 122 extending through the relevant through opening 124. The above designations may apply, of course, to a plurality of through openings 124 or even to all through openings 124 and the spacers 122 extending through them. These diameters make it possible to limit an air flow through the through openings 124 in the case of a displacement of the membranes 104, 106, which can in turn limit the noise contributions caused by the air flow.

The noise contributions caused by an air flow through the through openings 124 can additionally be reduced by a gas pressure that is lower than the normal pressure (approximately 1013 mbar) being present in a space S defined between the first and second membranes 104, 106, in which space the reference electrode 102 is arranged. The gas pressure in the space S can be less than 100 mbar, optionally less than 50 mbar, further optionally less than 10 mbar. Such a gas pressure additionally makes it possible to reduce the resistance caused by gas, for instance air, in the space S, said resistance counteracting a movement of the membranes 104, 106.

Further exemplary microelectromechanical microphones will be described below by reference to FIGS. 2 to 9. In this case, the same reference signs as in FIG. 1a, but increased by the number 100 or by an integral multiple of 100 are used for identical and functionally identical structural parts. The following embodiments will be described only insofar as they differ from the embodiment shown in FIG. 1a, to the description of which otherwise reference is expressly made.

Figure 2:
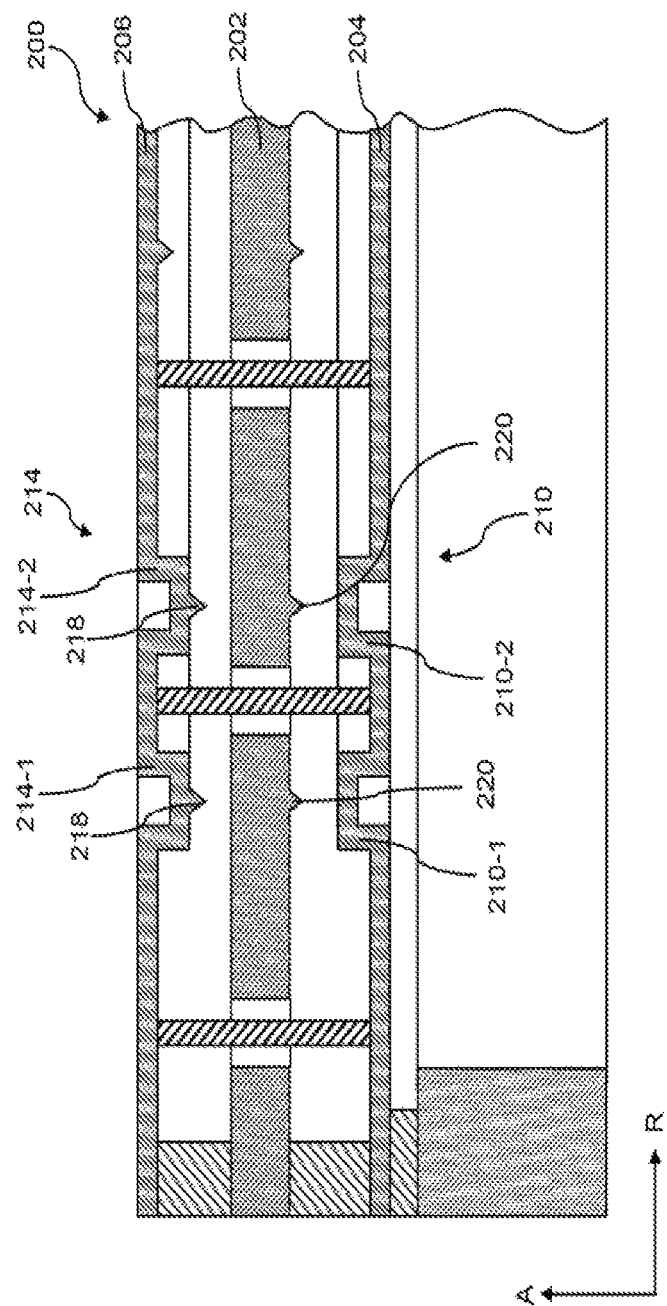
FIGS. 2 to 9 show schematic cross-sectional views of exemplary microelectromechanical microphones.

The exemplary microphone 200 shown in FIG. 2 differs from the microphone 100 shown in FIG. 1a in the configuration of the undulatory section 210 of the first membrane 204 and also in the configuration of the undulatory section 214 of the second membrane 206. In a manner similar to the microphone 100 shown in FIG. 1*a* the undulatory sections 210, 214 also comprise in each case a plurality of hollow projections, for example in each case two hollow projections 210-1, 210-2 and 214-1, 214-2, respectively, which protrude in each case in the direction toward the reference electrode 202, however, in contrast to the microphone 100. The technical effect achieved with hollow projections 210-1, 210-2, 214-1, 214-2 configured in this way can be the same as that achieved with the hollow projections 110-1, 110-2, 114-1, 114-2 described above. Furthermore, a microphone 200 having a smaller axial extent in comparison with the microphone 100 can be provided as a result. Furthermore, membrane anti-stick projections 218 are provided on the respective hollow projections 214-1 and 214-2, on an area thereof that faces the reference electrode 202. It goes without saying that membrane anti-stick projections 218 could also be provided on the hollow projections 210-1 and 210-2 of the first membrane 204. Alternatively, as shown in FIG. 2, electrode anti-stick projections 220 can be provided on the reference electrode 202 in a region situated opposite the hollow projections 210-1, 210-2.

Figure 3:
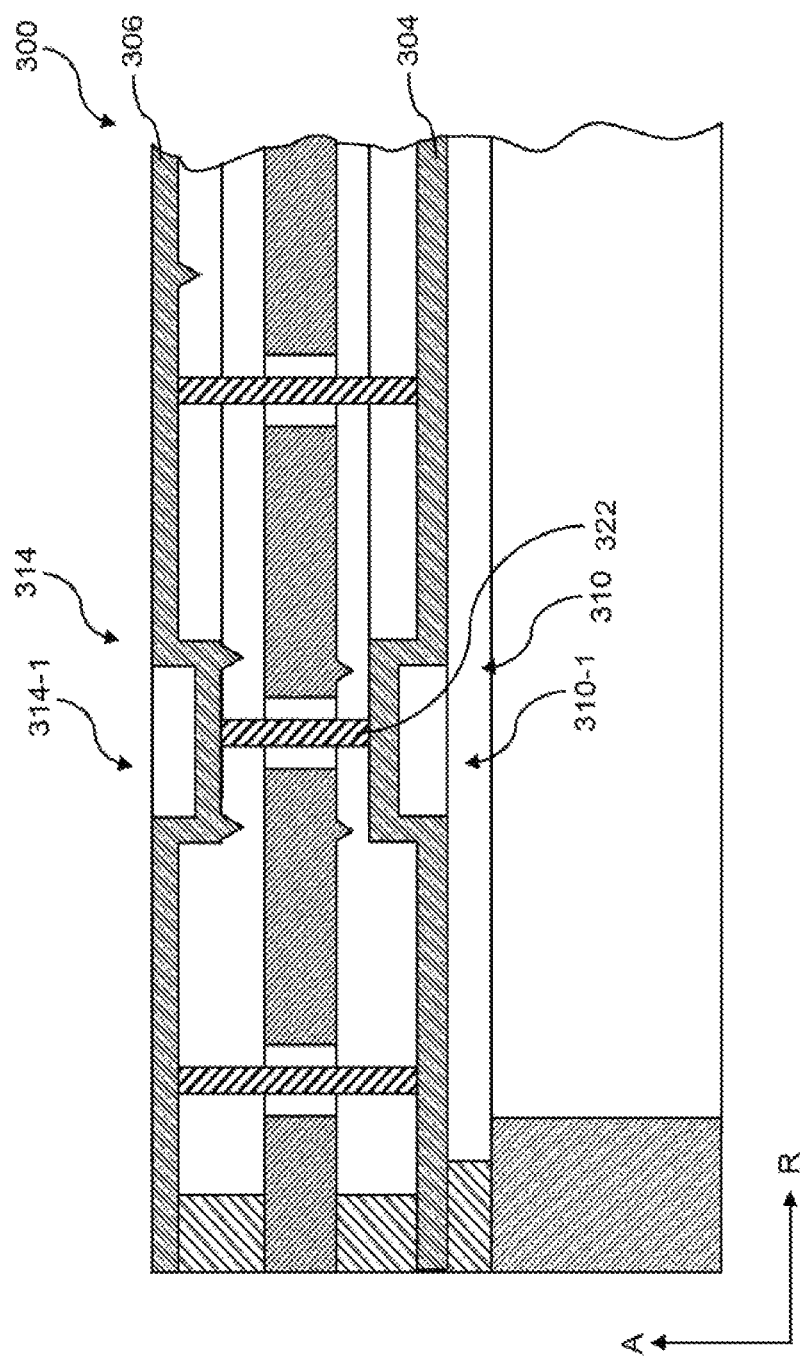

The exemplary microphone 300 shown in FIG. 3 differs from the microphone 200 shown in FIG. 2 in the configuration of the undulatory sections 310 and 314 of the first and second membranes 304, 306, respectively. In contrast to the microphone 200 shown in FIG. 2, the undulatory sections 310, 314 comprise in each case a smaller number of hollow projections than the microphone 200 shown in FIG. 2, for example in each case only a single hollow projection 310-1 and 314-1, respectively. Furthermore, the microphone 300 comprises a spacer 322, which connects the hollow projection 310-1 of the undulatory section 310 of the first membrane 304 to the hollow projection 314-1 of the undulatory section 314 of the second membrane 306. Such a spacer 322 can ensure a defined distance between the first and second membranes 304, 306 even if the corresponding hollow projections 310-1, 314-1 are deformed on account of mechanical stresses in the relevant membranes 304, 306.

Figure 4:
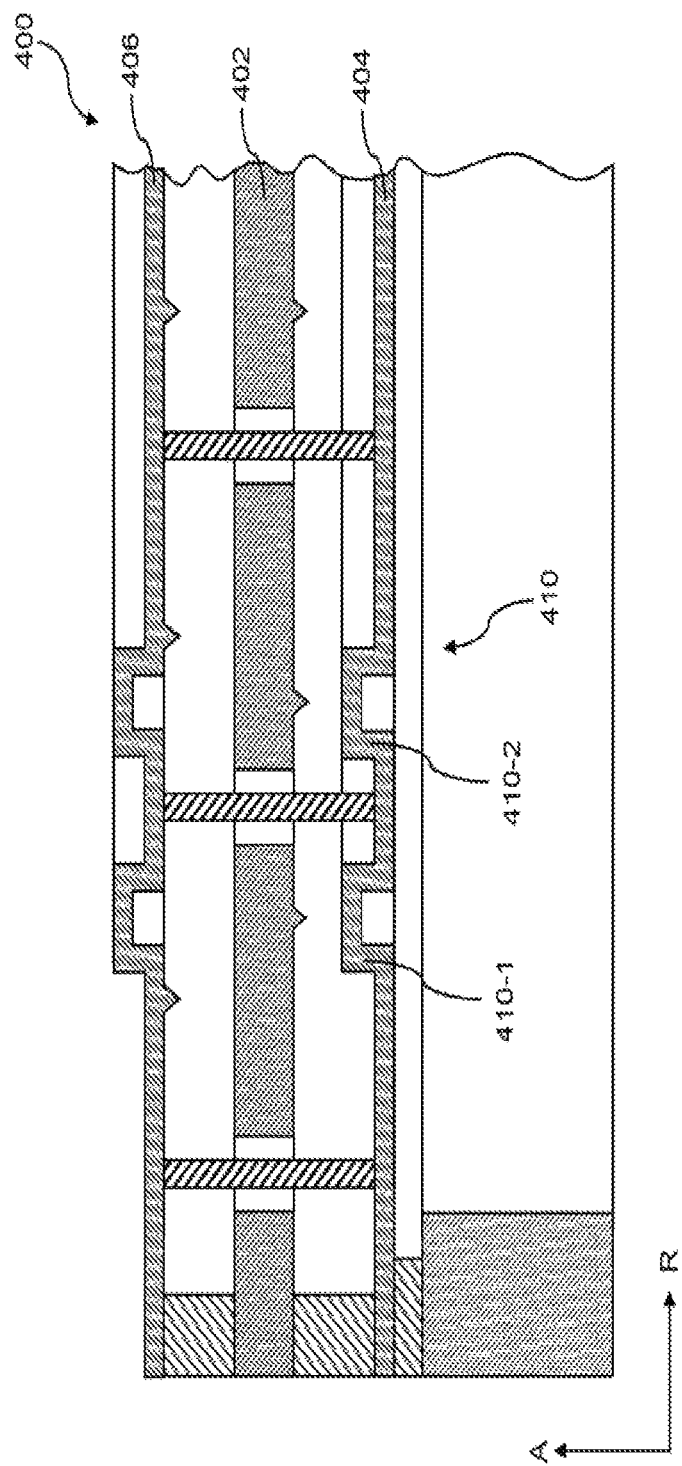

The exemplary microphone 400 shown in FIG. 4 differs from the microphone 100 shown in FIG. 1*a* in the configuration of the undulatory section 410 of the first membrane 404. Although said undulatory section also comprises a plurality of hollow projections, for example two hollow projections 410-1, 410-2, the latter protrude in a direction facing the reference electrode 402. By virtue of this configuration, the microphone 400 can be provided with a smaller axial extent in comparison with the microphone 100. Moreover, the first and second membranes 404, 406 can be produced by a similar production method since the hollow projections of the first and second membranes 404, 406 protrude in the same direction.

Figure 5:
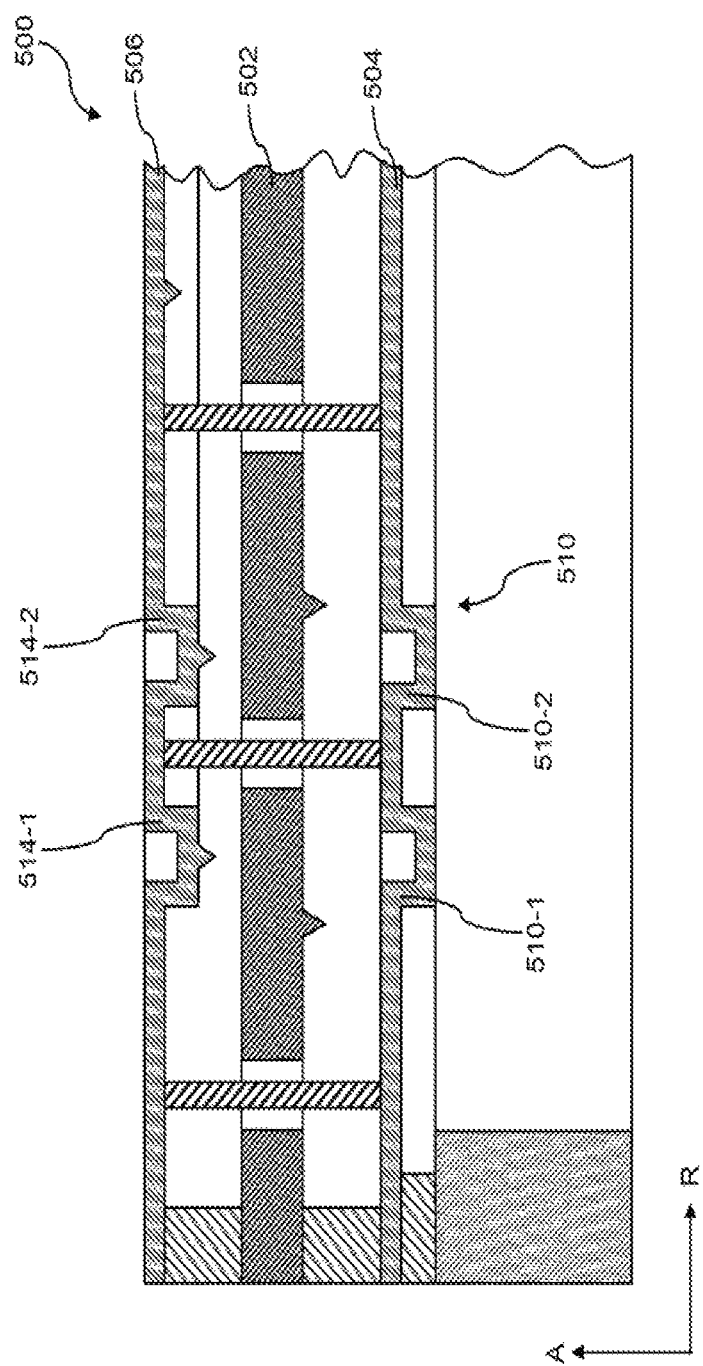

The microphone 500 shown in FIG. 5 differs from the microphone 200 shown in FIG. 2 with regard to the configuration of the undulatory section 510 of the first membrane 504. In a manner similar to the microphone 200, the undulatory section 510 of the first membrane 504 also comprises a plurality of hollow projections, for example two hollow projections 210-1, 210-2. In contrast to the microphone 200, however, said hollow projections protrude in a direction facing away from the reference electrode 502. By virtue of this configuration, the first and second membranes 504, 506 of the microphone 500 can be produced in a simple manner since the hollow projections 510-1, 510-2 and 514-1, 514-2 of the first and second membranes 504, 506, respectively, protrude in the same direction and they can therefore be formed by a similar or identical production method.

Figure 6:
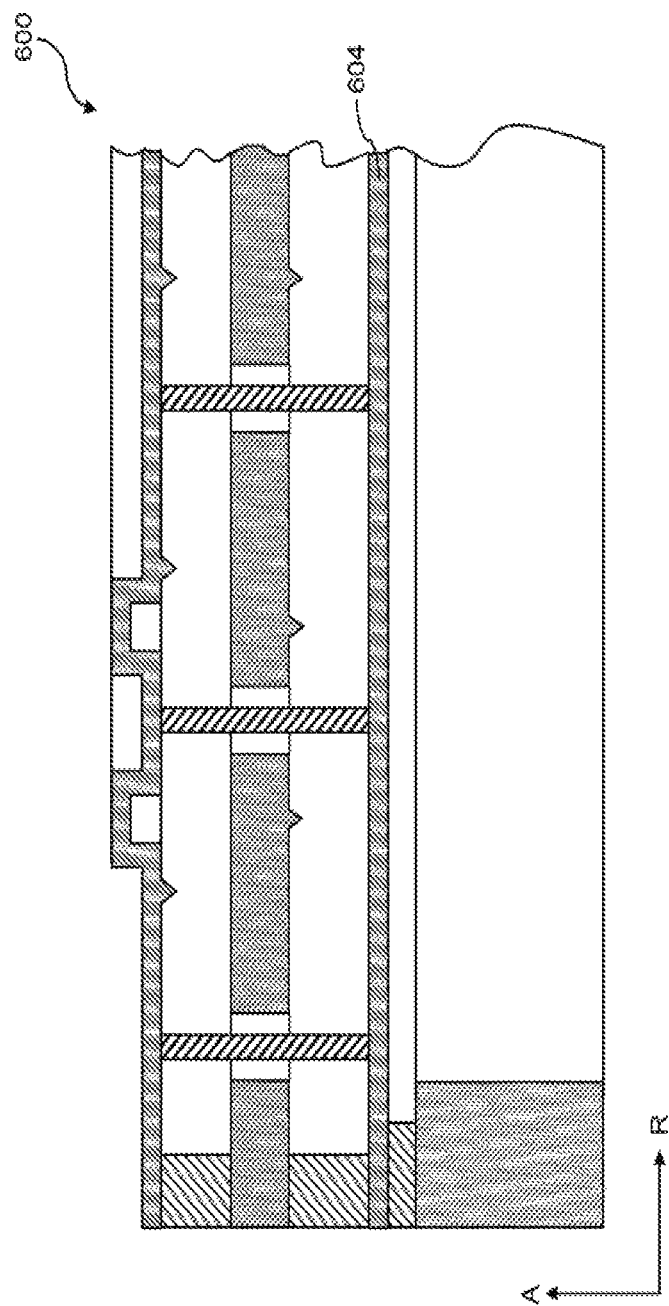

The exemplary microphone 600 in accordance with FIG. 6 differs from the microphone 100 shown in FIG. 1*a* with regard to the configuration of the first membrane 604. In contrast to the membrane 104 of the microphone 100 shown in FIG. 1*a*, said first membrane does not comprise an undulatory section, but rather is embodied as an altogether planar component. This configuration is appropriate particularly if, owing to the dictates of production, the first membrane 604 can be manufactured for example with low intrinsic stresses.

Figure 7:
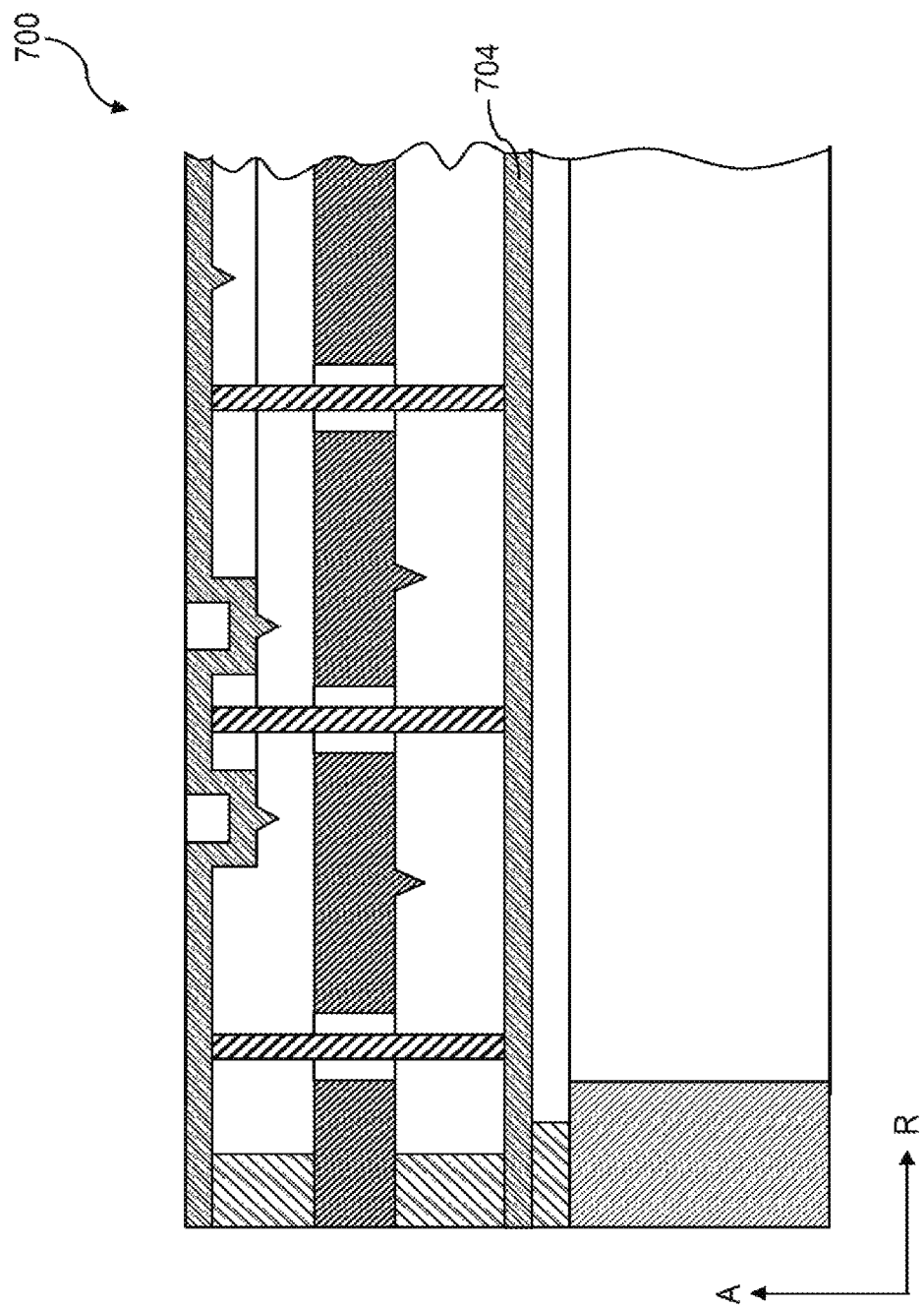

The exemplary microphone 700 in accordance with FIG. 7 differs from the microphone 200 shown in FIG. 2 with regard to the configuration of the first membrane 704. In contrast to the membrane 204 of the microphone 200 shown in FIG. 2, said first membrane does not comprise an undulatory section, but rather is embodied as an altogether planar component. This configuration is appropriate particularly if, owing to the dictates of production, the first membrane 704 can be manufactured with low intrinsic stresses.

Figure 8:
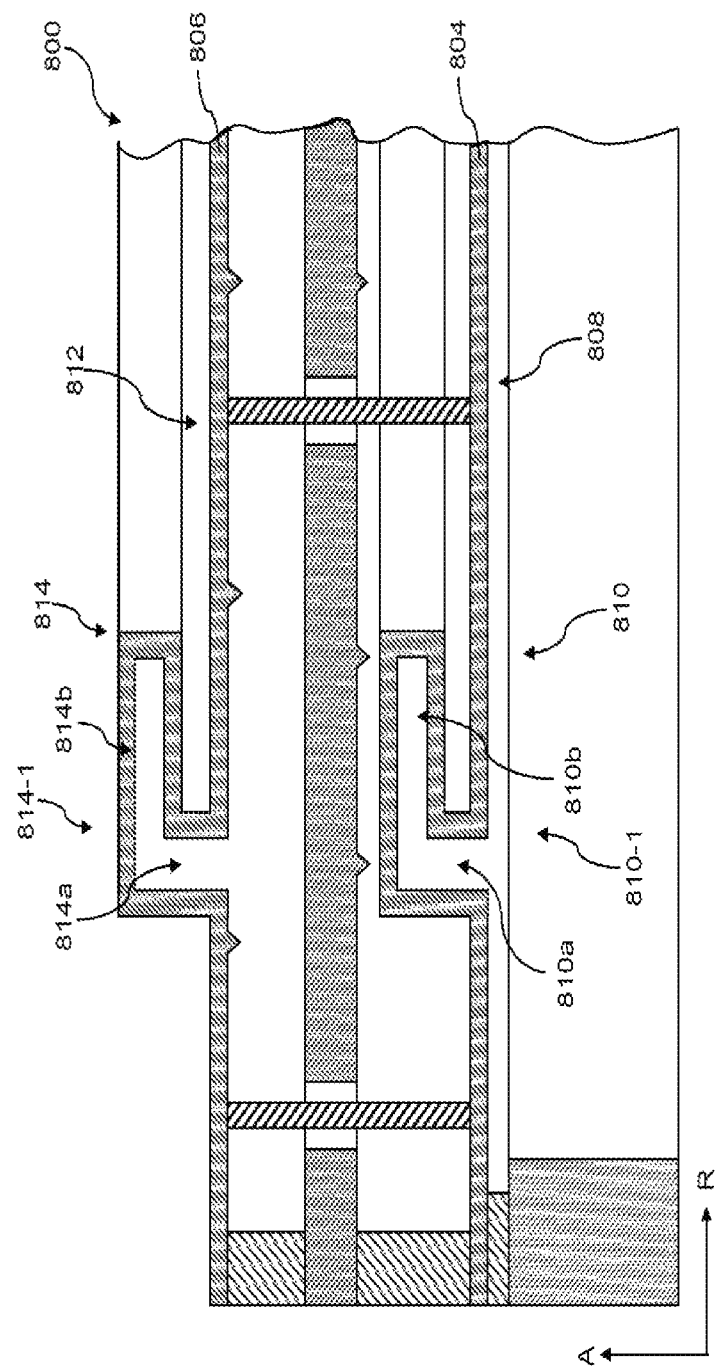

The exemplary microphone 800 shown in FIG. 8 differs from the microphones above in particular in the configuration of the undulatory sections 810, 814 of the first and second membranes 804, 806, respectively. The undulatory sections 810 and 814 are embodied in each case as hollow projections 810-1 and 814-1, respectively, and comprise in each case a first section 810*a* and 814*a*, respectively, extending substantially orthogonally to the respective planar sections 808 and 812, and a second section 810*b* and 814*b*, respectively, adjacent to the respective orthogonal sections 810*a*, 814*a* and extending in each case substantially parallel to the respective planar sections 808 and 812. Hollow projections having angular cross sections are thus realized as a result. By virtue of this configuration, in the undulatory sections 810, 814 it is possible to utilize more degrees of freedom of deformation for the compensation of mechanical stresses in the first and second membranes 804, 806, respectively, as a result of which ultimately a high compliance of the respective undulatory sections 810, 814 can be achieved.

It goes without saying that the hollow projections 810-1 and 814-1, respectively, need not face in the same direction, but rather can be varied with regard to their orientation in a manner similar to the configurations in accordance with FIGS. 1*a* to 7.

Figure 9:
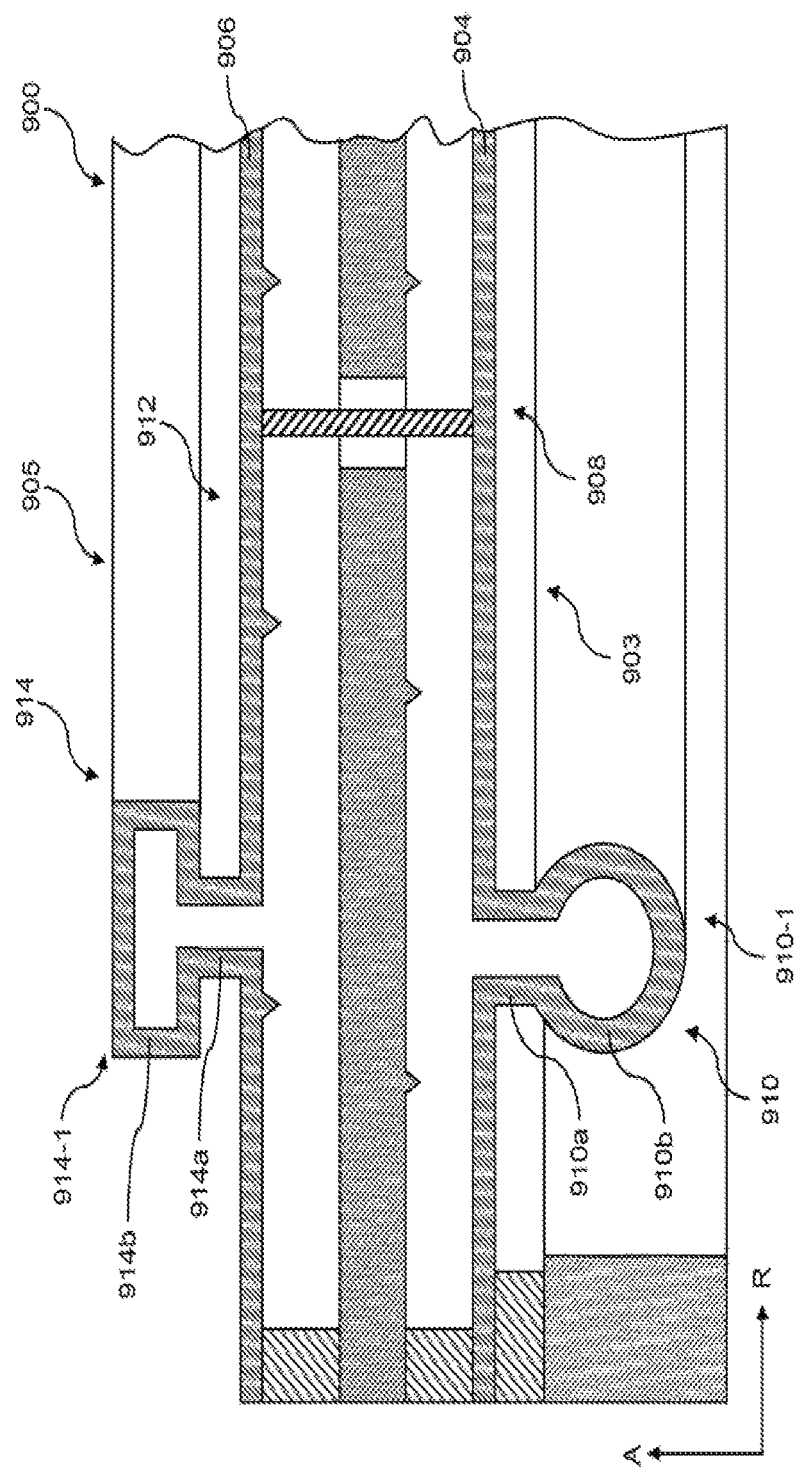

Virtually no limits are imposed on the concrete configuration of a cross section of a hollow projection. They can be realized with a multiplicity of further cross sections in order to satisfy concrete requirements. A further exemplary microphone 900 is shown in FIG. 9. Said microphone comprises a first membrane 904 having an undulatory section 910 and also a second membrane 906 having an undulatory section 914. The undulatory sections 910, 914 are embodied in each case as hollow projections 910-1 and 914-4 respectively, which have mutually different cross-sectional shapes.

The hollow projection 910-1 of the first membrane 904 can comprise a first section 910*a*, which extends substantially orthogonally to a planar section 908 of a region 903 of the first membrane 904 that is displaceable by sound, and a second section 910*b* adjacent to the first section 910*a* and having a substantially elliptic or circular cross section.

The hollow projection 914-1 of the second membrane 906 can comprise a first section 914*a*, which extends substantially orthogonally to a planar section 912 of a region 905 of the second membrane 906 that is displaceable by sound, and a second section 914*a* adjacent to the first section 914*a* and having a substantially rectangular cross section. As shown in FIG. 9, the first and second sections 914*a* and 914*b* together can define a T-shaped cross section.

Even though this is not shown in FIGS. 2 to 9, the respective reference electrodes can have a layer construction in accordance with FIG. 1b. Likewise at least one spacer, optionally a plurality of spacers, further optionally each spacer, can be embodied integrally with one or with both of the respective membranes. Furthermore, the respective first or/and second membranes can be segmented with the aid of insulation sections in a similar manner to the microphone 100 shown in FIG. 1a, in order to comprise respective dynamic sections.

One exemplary method for producing a membrane of a microelectromechanical microphone in accordance with FIG. 8 is shown below by reference to FIGS. 10 to 20.

Figure 10:
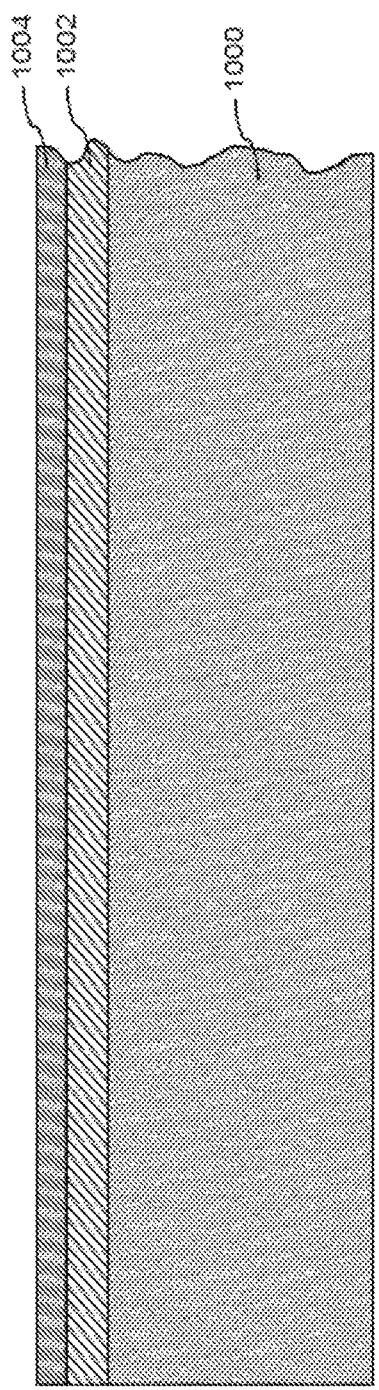
FIGS. 10 to 20 show a method for producing a membrane of a microelectromechanical microphone in accordance with FIG. 8.

The starting point of the method may be providing a substrate 1000, for instance a substrate composed of a semiconductor material, such as crystalline silicon, for instance. Onto said substrate, as indicated in FIG. 10, it is possible to deposit firstly an electrically insulating layer 1002, for instance an oxide layer, e.g. SiOx, and then a membrane material layer 1004, for example by chemical vapor deposition (CVD) or by sputtering. The membrane material layer 1004 can be formed from an electrically conductive material, such as, for instance, from a metal or from a polycrystalline semiconductor material, for example from polycrystalline silicon.

Figure 11:
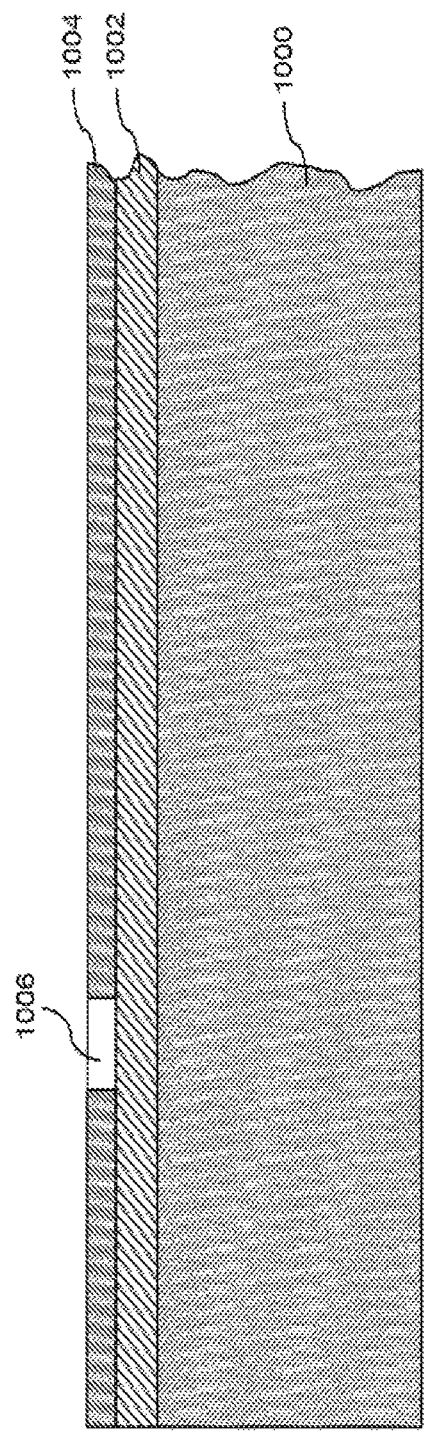
Figure 12:
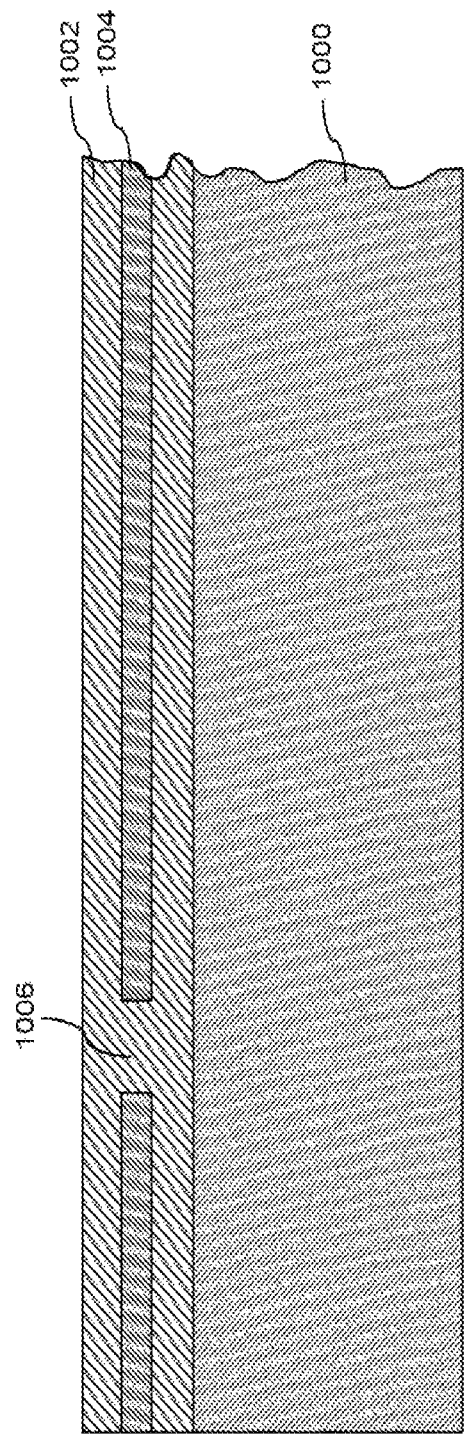

Afterward, as shown in FIG. 11, it is possible to form a through opening 1006 in the membrane material layer 1004, for instance by etching. A further sacrificial layer can then be deposited onto the membrane material layer 1004 and also into the through opening 1006 formed in the membrane material layer 1004 (cf. FIG. 12). The further sacrificial layer can be formed from the same material as the sacrificial layer 1002. It is thereby possible to form an integral sacrificial layer which comprises the original sacrificial layer and extends partly above the membrane material layer 1004. The sacrificial layer formed thereby will be referred to as sacrificial layer and provided with the reference sign 1002 in the following description.

Figure 13:
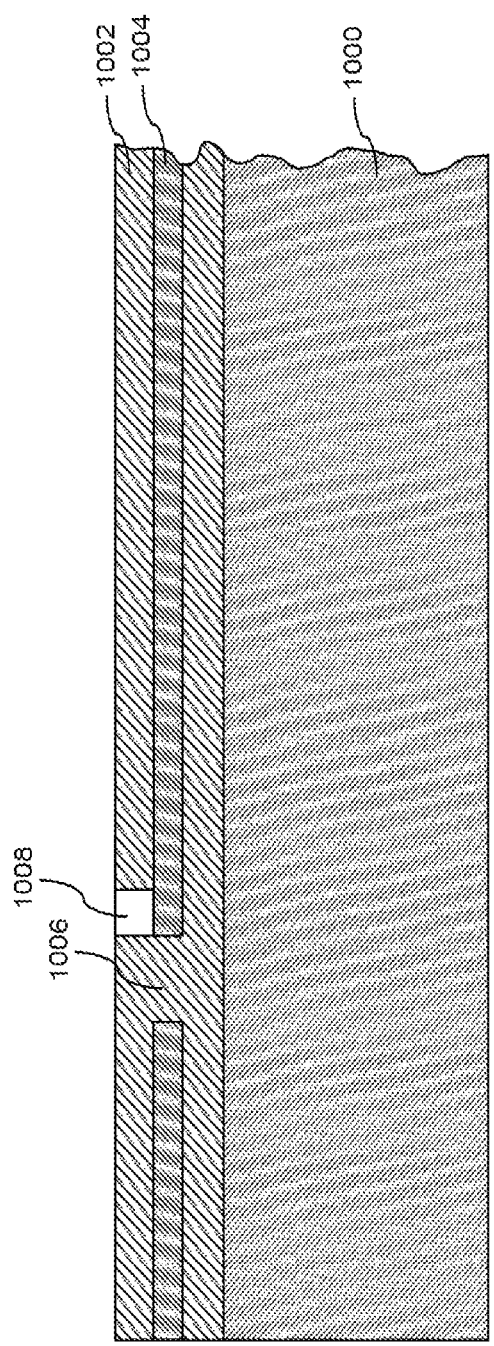
Figure 14:
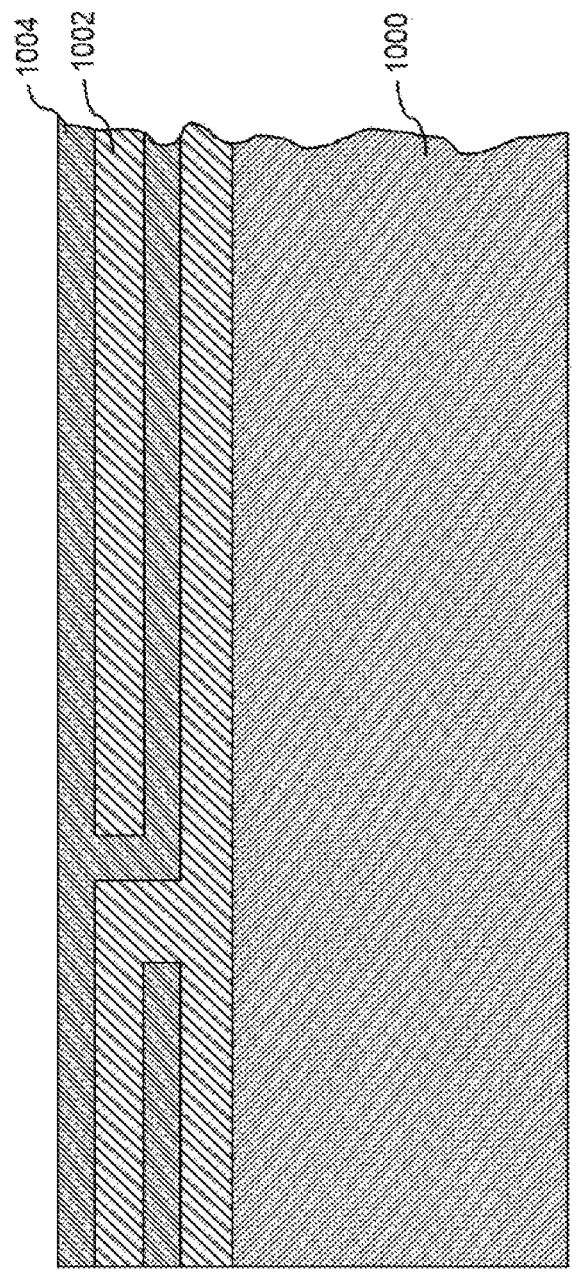
Figure 15:
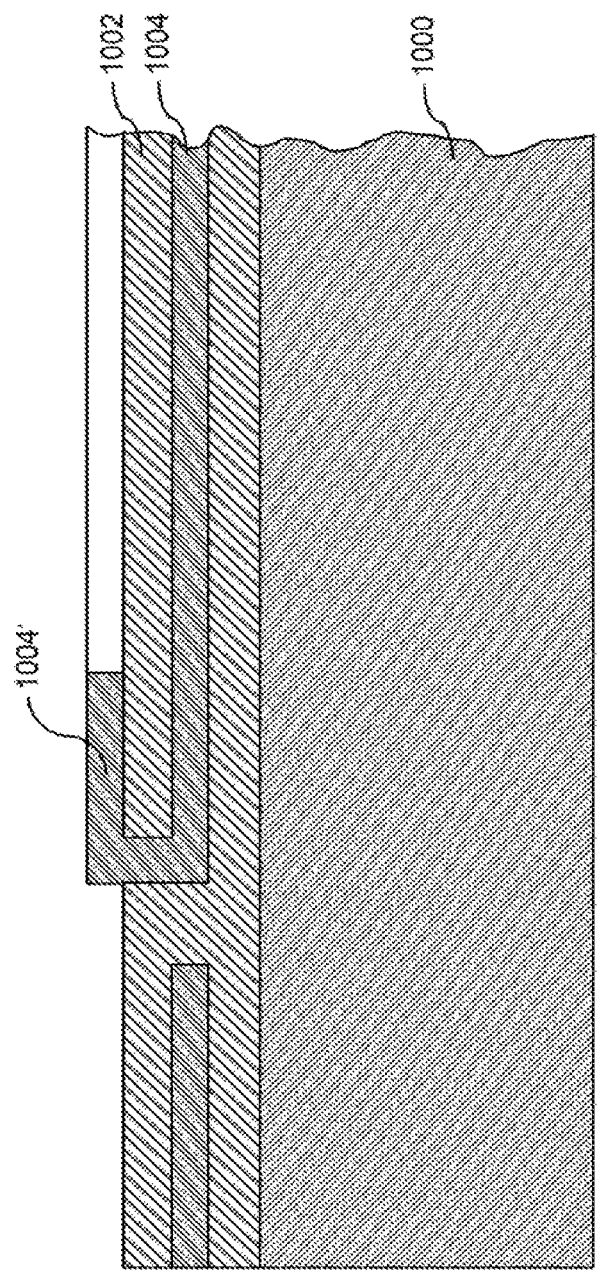

An opening 1008 can then be formed in the sacrificial layer 1002, which opening exposes an edge region of the membrane material layer 1004 that delimits the through opening or cutout 1006 in the membrane material layer 1004 (FIG. 13). A further membrane material layer can then be deposited onto the sacrificial layer 1002 and also into the opening 1008 (FIG. 14). As a result, as shown in FIG. 14, a substantially integral membrane material layer comprising the original membrane material layer 1004 can be formed. The latter hereinafter will be referred to as membrane material layer and provided with the reference sign 1004. The membrane material layer 1004 can subsequently be structured, as shown in FIG. 15. As a result, by way of example, a web-shaped section 1004' composed of membrane material can be formed on the sacrificial layer 1002.

Figure 16:
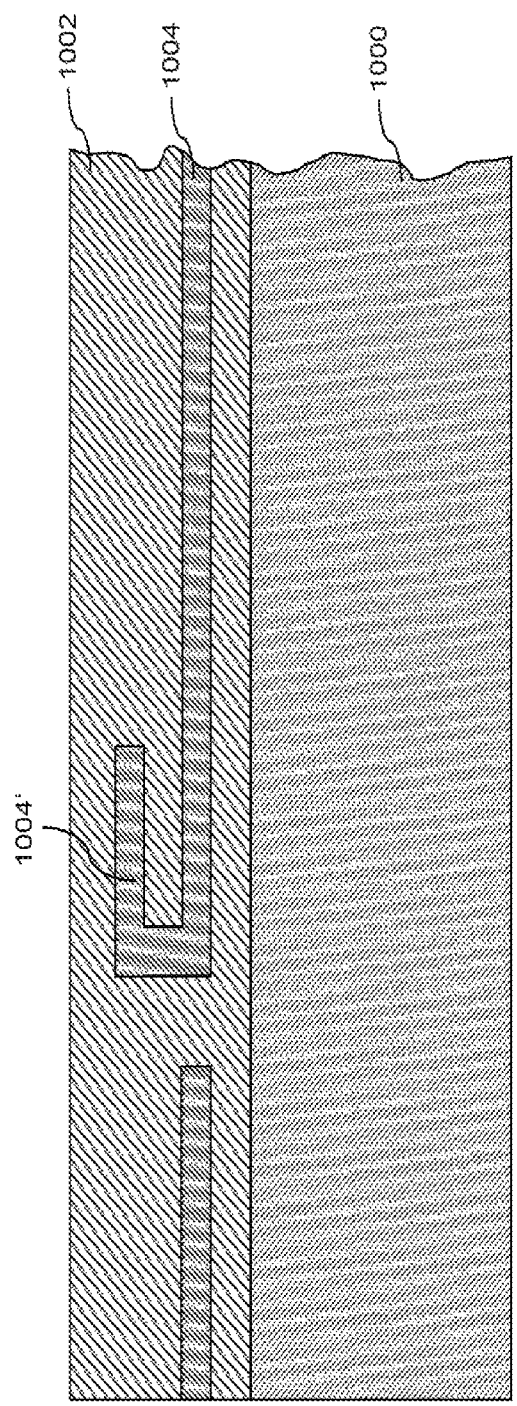

A further sacrificial layer can then be deposited onto the web-shaped section 1004' and also onto the sacrificial layer 1002 (FIG. 16). Said further sacrificial layer can be formed from the same material as the existing sacrificial layer 1002. It is thereby possible to form with the existing sacrificial layer 1002 an integral sacrificial layer, which hereinafter is referred to generally as sacrificial layer and provided with the reference sign 1002.

Figure 17:
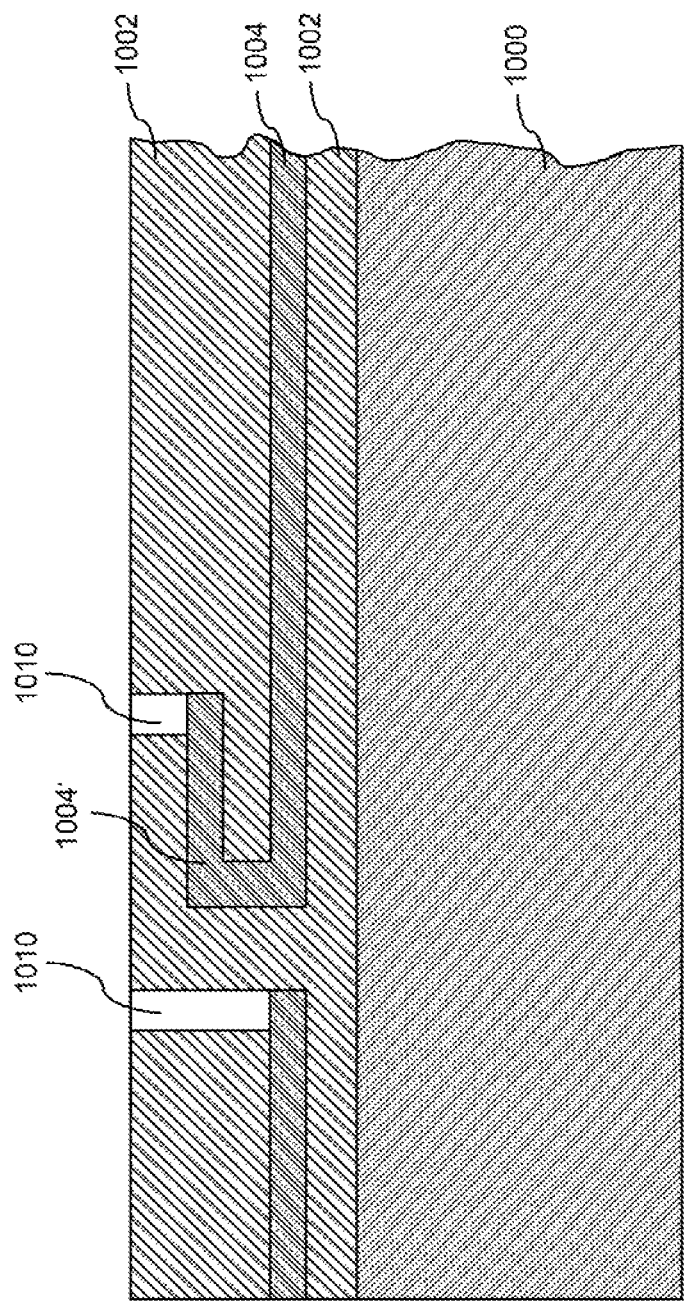
Figure 18:
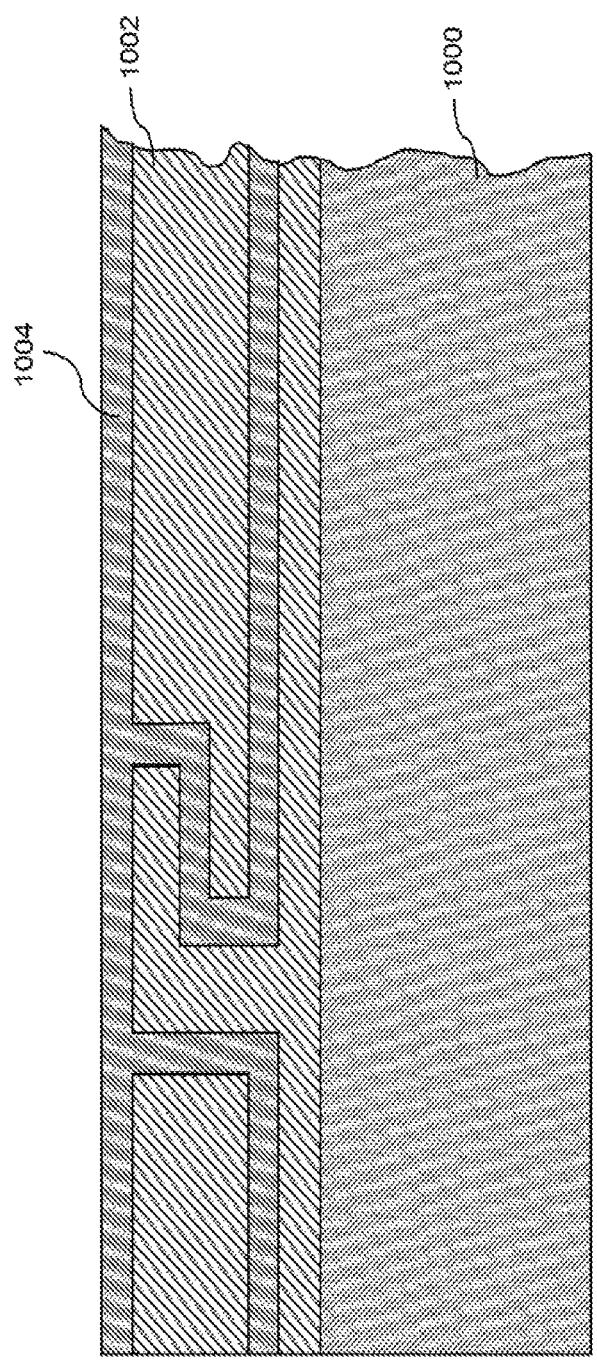
Figure 19:
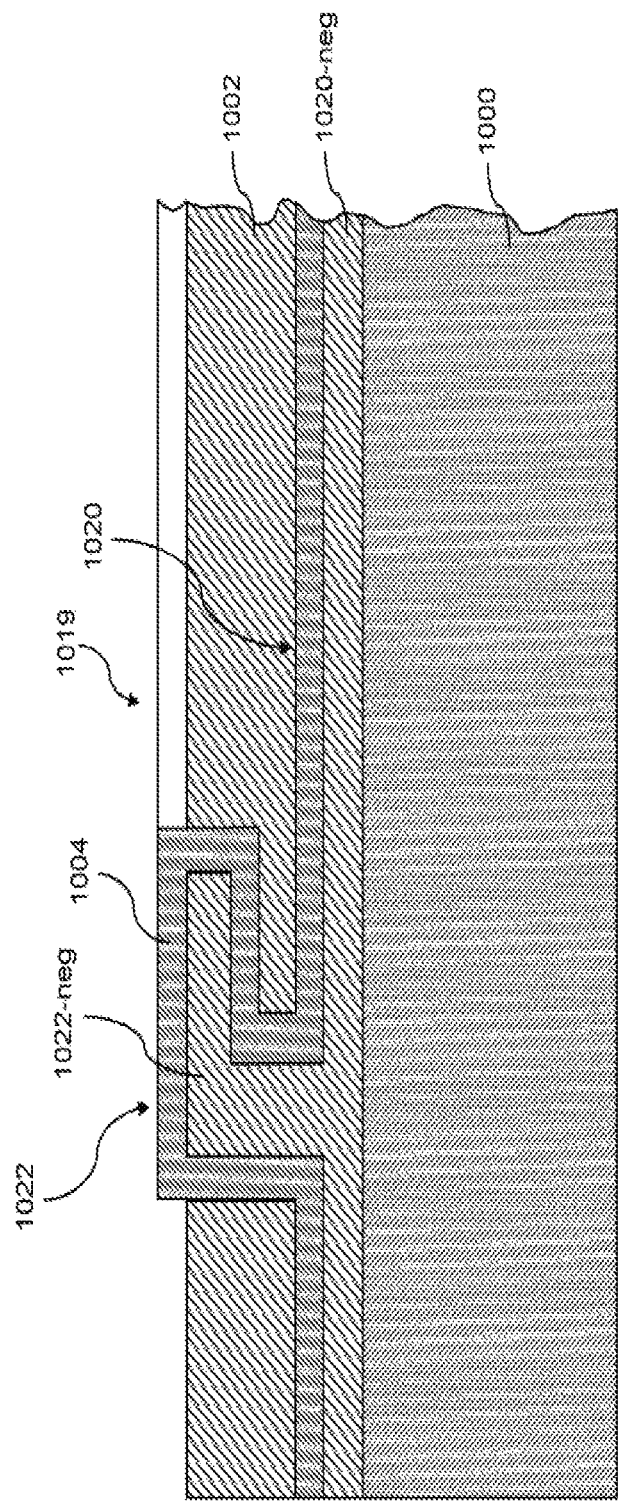

As shown in FIG. 17, openings low can subsequently be formed in the sacrificial layer 1002, for instance by etching, which openings expose edge regions of the membrane material layer 1004 and of the web-shaped section 1004'. Afterward, as shown in FIG. 18, a further membrane material layer can be deposited into the openings low and also onto the sacrificial layer 1002. It is thereby possible to form an integral membrane material layer 1004, which, as shown in FIG. 19, can subsequently be structured. A membrane 1004 can be formed as a result.

Figure 20:
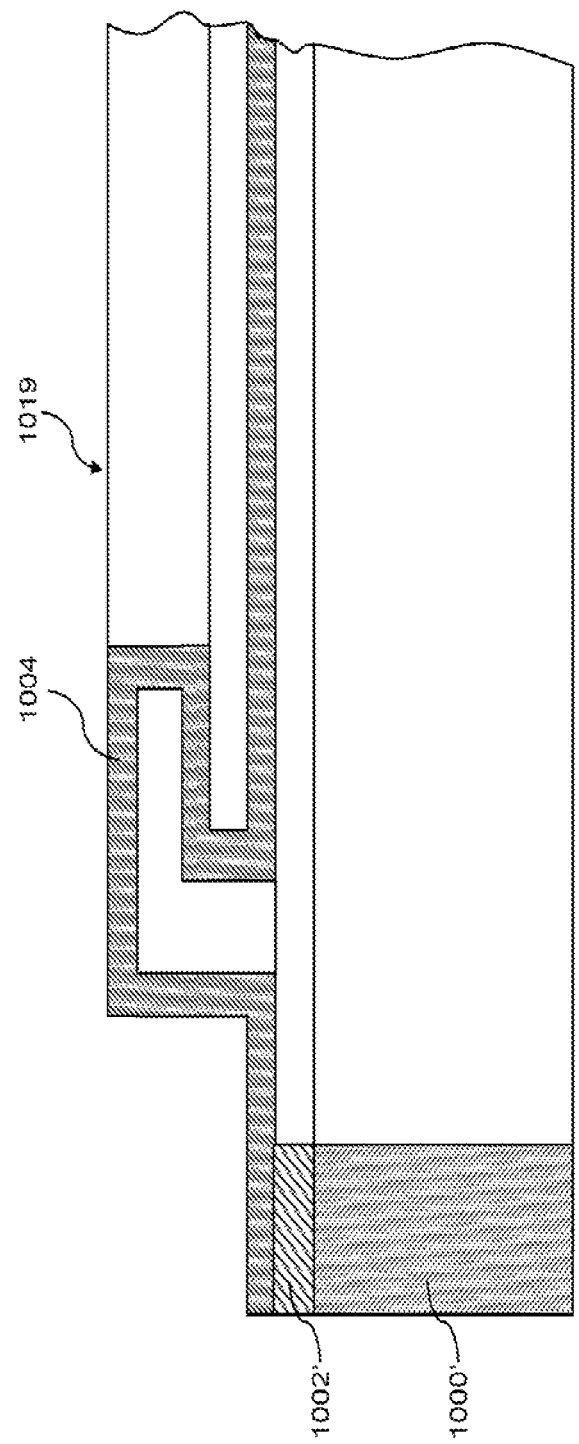

Afterward, as shown in FIG. 20, a part of the sacrificial layer 1002 and also a part of the substrate woo can be removed, for instance by etching. As a result, the membrane 1004 is exposed and a holder 1000' for the membrane 1004 is formed. As shown in FIG. 20, a part of the sacrificial layer 1002' can remain in an edge region between the holder 1000' and the membrane 1004, which can serve as a supporting element, discussed in association with FIG. 1a.

Like the membranes described above by reference to FIGS. 1a to 9, the membrane 1004 shown in FIGS. 19 and 20 comprises a region 1019 displaceable by sound and having a planar section 1020 and an undulatory section 1022. The sacrificial layer 1002 here serves as a negative mold for producing the membrane 1004. This comprises, as shown in FIG. 19, a first section 1020-neg, which is complementary to the planar section 1020, and also a second section 1022-neg which is complementary to the undulatory section 1022. As shown in FIG. 19, the second section 1022-neg comprises a projection or is embodied as a projection. As described above, regions of the projection are formed after sections of the membrane 1004 have been produced. In this way, it is possible to produce a projection having a complex construction and thus an undulatory section 1022 having a complex construction, such as, for instance, a projection having an angular cross section as shown in FIGS. 8 and 19. As a result, it is possible, in turn, for the stress compensation capability of the projection to be individually adapted to production-dictated conditions.

One exemplary method for producing a microelectromechanical microphone having a similar construction to the microphone 900 shown in FIG. 9 is described below by reference to FIGS. 21 to 40.

Figure 21:
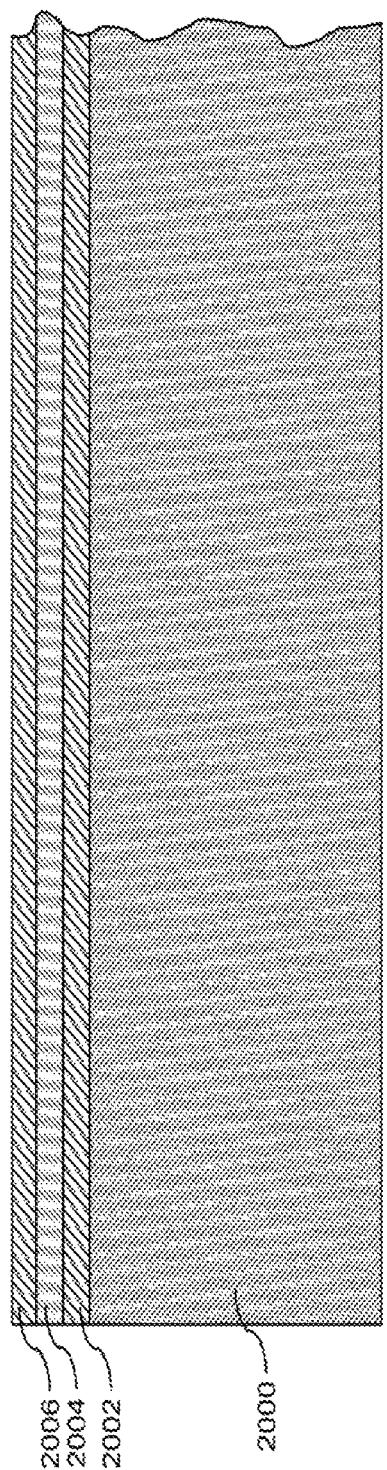
FIGS. 21 to 40 show a method for producing a microelectromechanical microphone in accordance with FIG. 9.

The starting point of the method, as shown in FIG. 21, may be depositing a first sacrificial layer 2002 onto a substrate 2000, and then a first protective layer 2004 can be deposited onto said first sacrificial layer and a second sacrificial layer 2006 can be deposited onto said protective layer. The substrate 2000 can consist for example of a semiconductor material, for instance of silicon, optionally of crystalline silicon. The first sacrificial layer 2002 or/and the second sacrificial layer 2006 can be formed from an electrically insulating material, for instance an oxide, for example SiOx. The first protective layer 2004 can be formed from a nitride, for instance SixNy. The first protective layer 2004 can serve as an etch stop layer in the further method.

Figure 22:
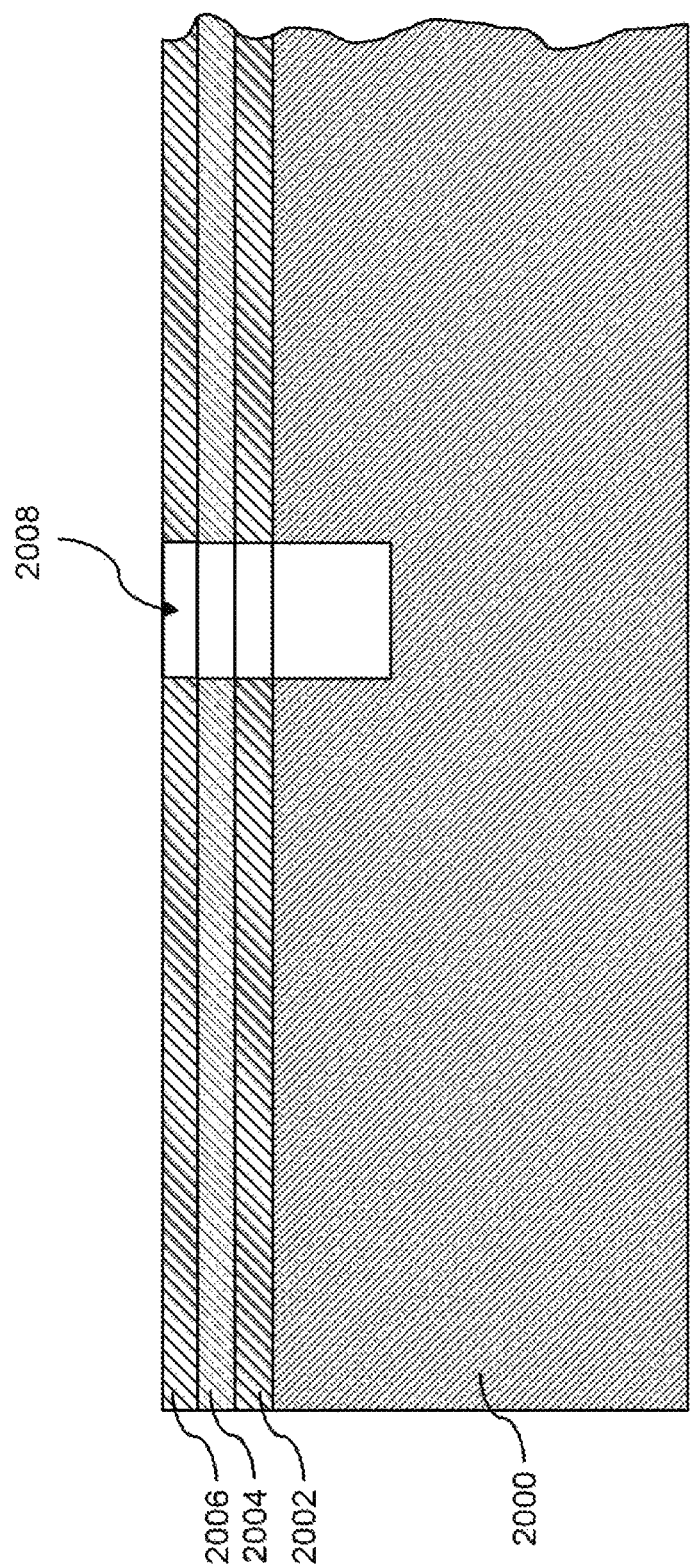
Figure 23:
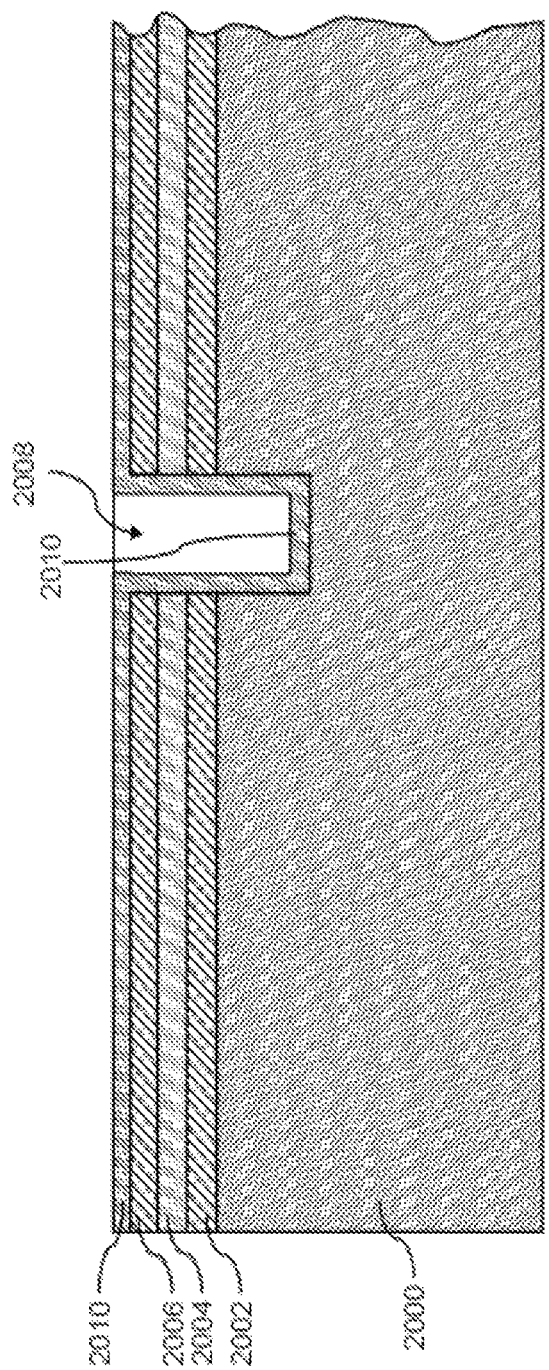

As shown in FIG. 22, a first cavity 2008 can then be formed into the substrate 2000 through the first sacrificial layer 2002, the first protective layer 2004 and the second sacrificial layer 2006, for instance by etching. Afterward, a second protective layer 2010 can be applied on the second sacrificial layer 2006 and also on those sections of the substrate 2000, of the first sacrificial layer 2002, of the first protective layer 2004 and also of the second sacrificial layer 2006 which delimit the first cavity 2008, for instance by chemical vapor deposition (FIG. 23).

Figure 24:
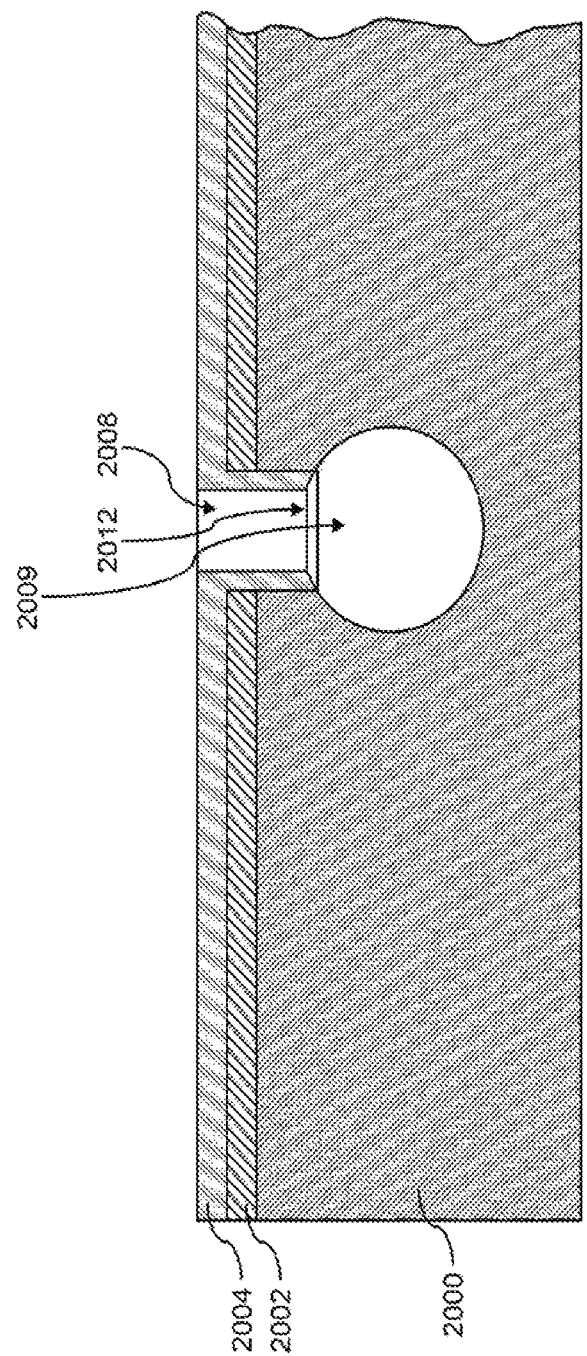

Afterward, as shown in FIG. 24, the layer stack can be removed from the side facing away from the substrate 2000 as far as the first protective layer 2004, for example by selective etching. Consequently, the second protective layer 2010 is still present only in the first cavity 2008 and, as indicated in FIG. 24, can be integrally connected to the first protective layer 2004. Therefore, the first and second protective layers 2004 and 2010 are referred to generally as protective layer and provided with the reference sign 2004 in the following description.

In principle, a membrane material layer could then be applied on the protective layer 2004, in order to form a membrane having an undulatory section embodied as a hollow projection, for which the first cavity 2008 can serve as a negative mold. A hollow projection formed thereby would have a cross section having a substantially rectangular shape.

Alternatively, as shown in FIG. 24, it is possible to form an opening 2012 in the protective layer 2004 within the first cavity 2008, as a result of which the substrate 2000 can be exposed. Through the opening 2012 formed in the protective layer 2004, it is then possible to form a second cavity 2009 connected to the first cavity 2008, which second cavity can have a cross-sectional shape that is different from the first cavity 2008, for example an elliptic or circular cross-sectional shape. The second cavity 2009 can be formed by isotropic etching, for example. In this case, that section of the protective layer 2004 which is provided in the first cavity 2008 can serve as an etch stop layer in order that the shape of the first cavity 2008 is not altered by the isotropic etching.

Figure 25:
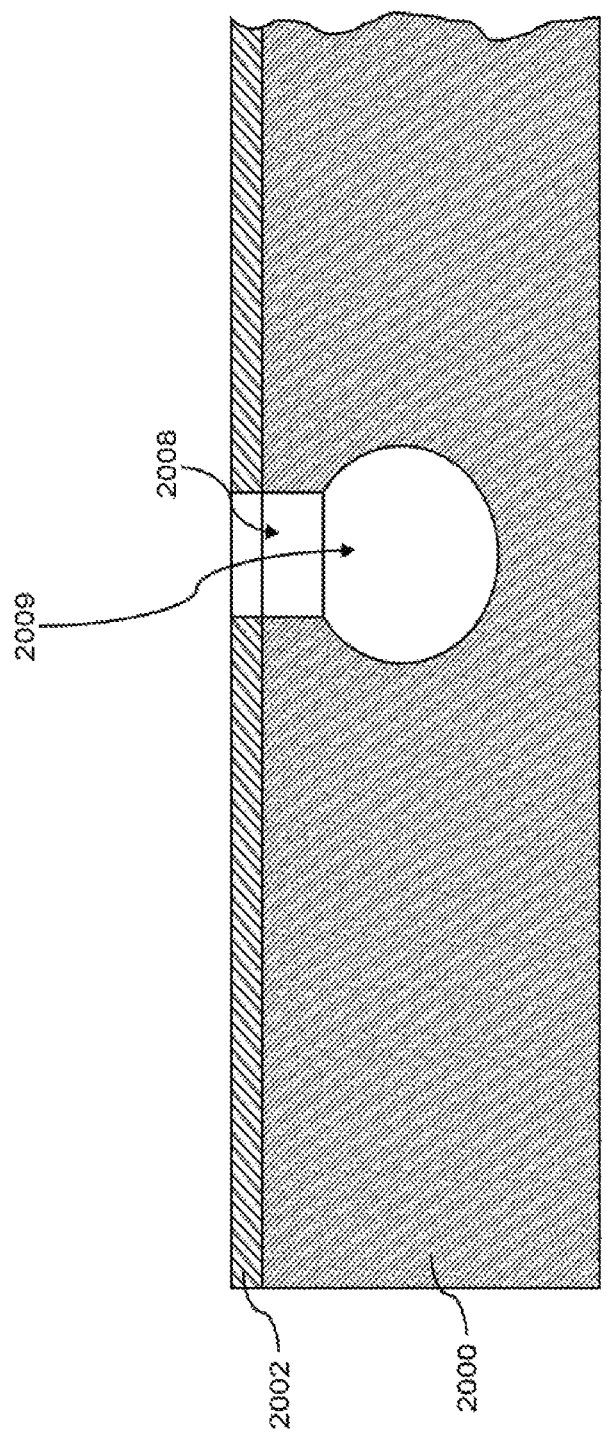

Afterward, as shown in FIG. 25, the protective layer 2004 can be removed, as a result of which the first sacrificial layer 2002 is exposed. The first sacrificial layer 2002 can then be continued into the first and second cavities 2008, 2009, that is to say that the first and second cavities 2008 and 2009 can be lined with a sacrificial layer which can be integral with the first sacrificial layer 2002. Therefore, reference is made generally to a sacrificial layer 2002 in the following description (FIG. 26).

Figure 26:
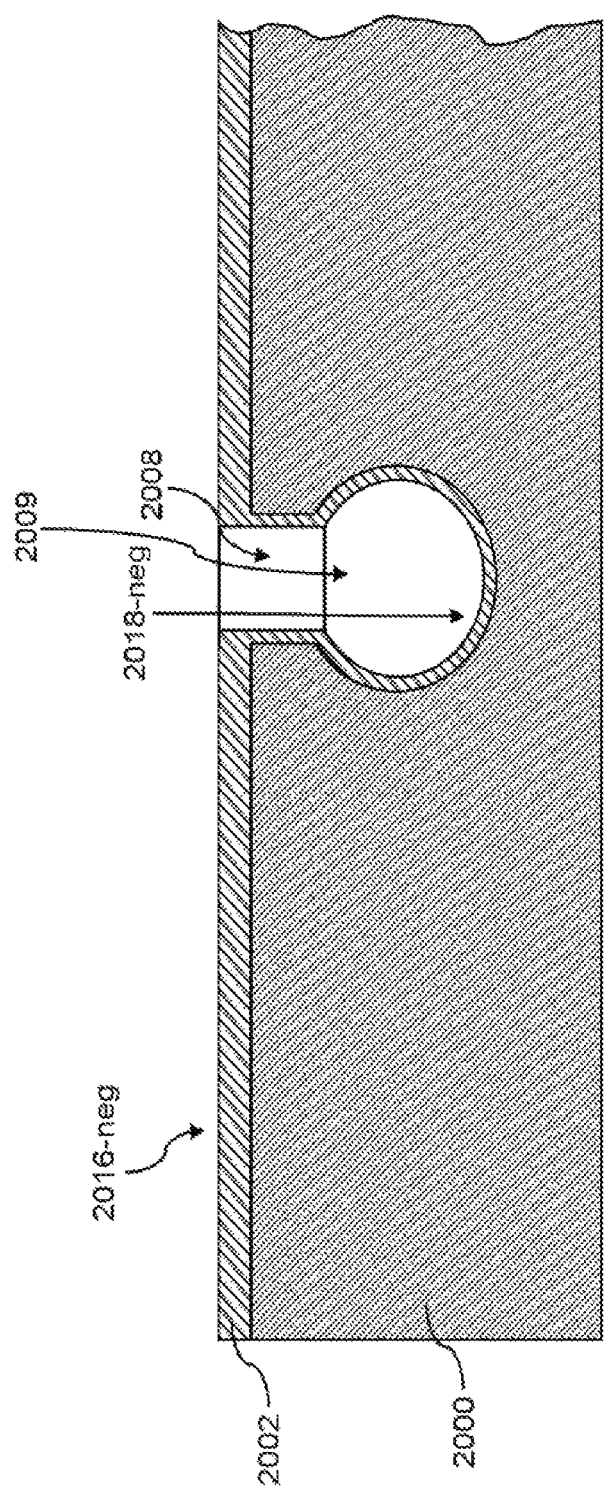
Figure 27:
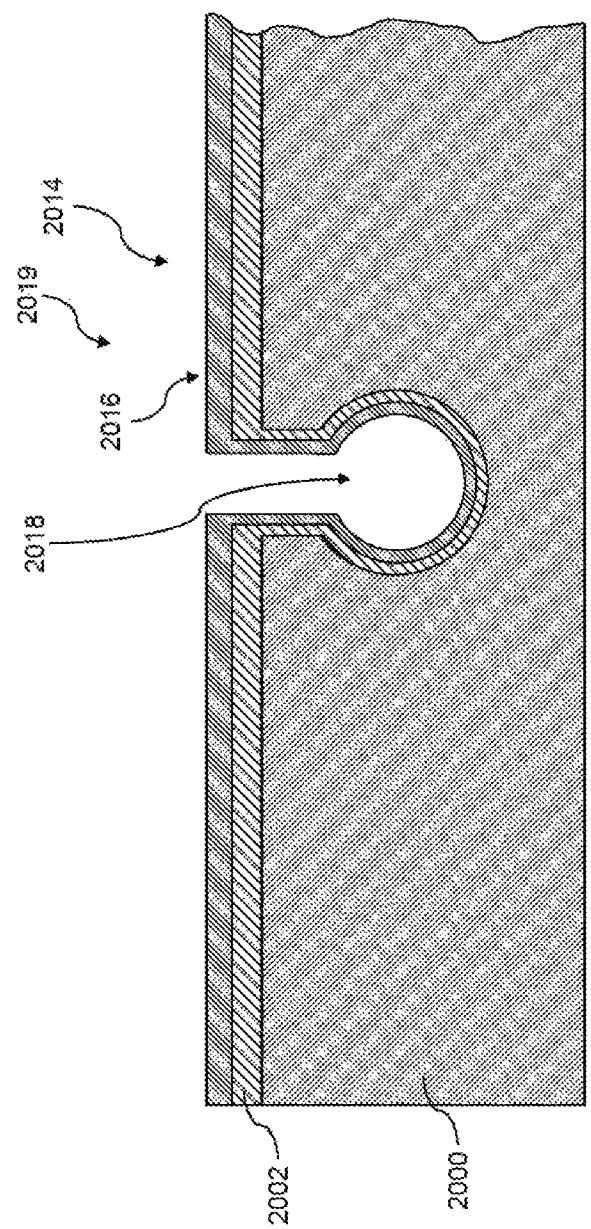

A first membrane material layer 2014 can then be applied (FIG. 27) on the sacrificial layer 2002 shown in FIG. 26, for example by chemical vapor deposition or by sputtering. The first membrane material layer 2014 can be formed from an electrically conductive material, for instance from a metal or from a polycrystalline semiconductor material, e.g. silicon. The first membrane material layer 2014 corresponds to a first membrane 2014, and the sacrificial layer 2002 shown in FIG. 26 corresponds to a negative mold for the first membrane 2014. In this case, the plane section of the first sacrificial layer 2002 outside the first and second cavities 2008, 2009 constitutes a first section 2016-neg having a shape that is complementary to a planar section 2016 of a region 2019 of the first membrane 2014 that is displaceable by sound, and the section of the sacrificial layer 2002 within the first and second cavities 2008, 2009 constitutes a second section 2018-neg having a shape complementary to an undulatory section 2018 of the region 2019 of the first membrane 2014 that is displaceable by sound.

By removing a part of the substrate 2000 and the sacrificial layer 2002, it is possible for the first membrane 2014 to be exposed. This will be shown and described in detail later.

Figure 28:
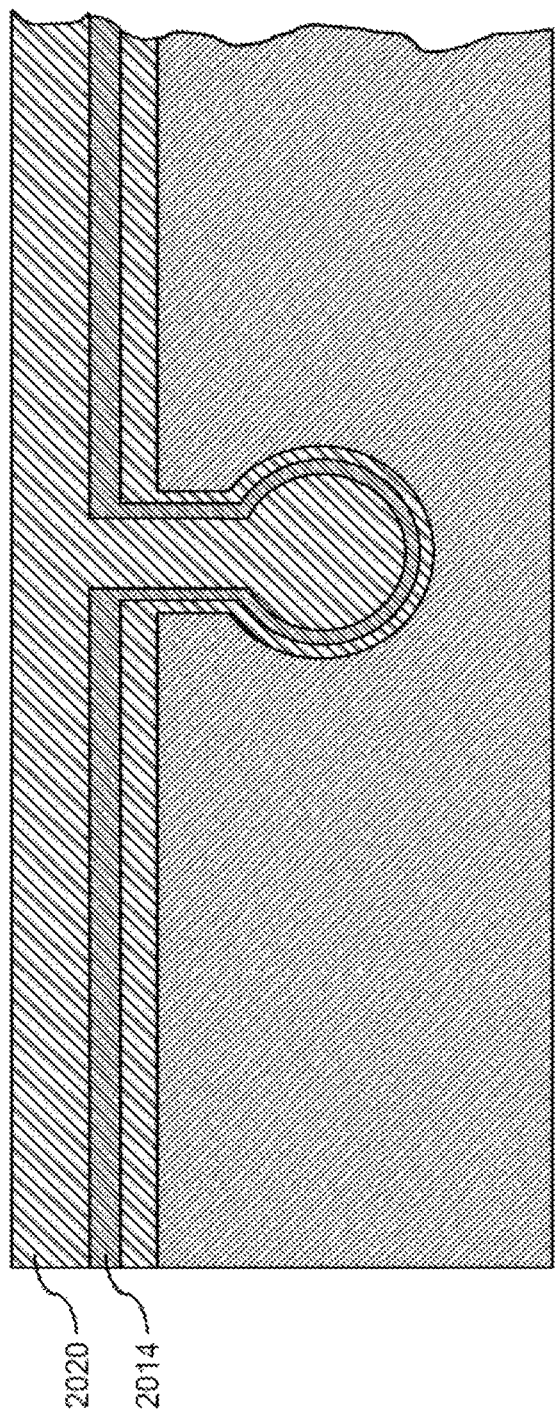

As shown in FIG. 28, a membrane sacrificial layer 2020 can be deposited onto the first membrane 2014. Said membrane sacrificial layer can cover the first membrane 2014 over the whole area and therefore effectively protect it against further external influences during subsequent processes. The membrane sacrificial layer 2020 can consist for example of an electrically insulating material, for example an oxide, for instance SiOx.

Figure 29:
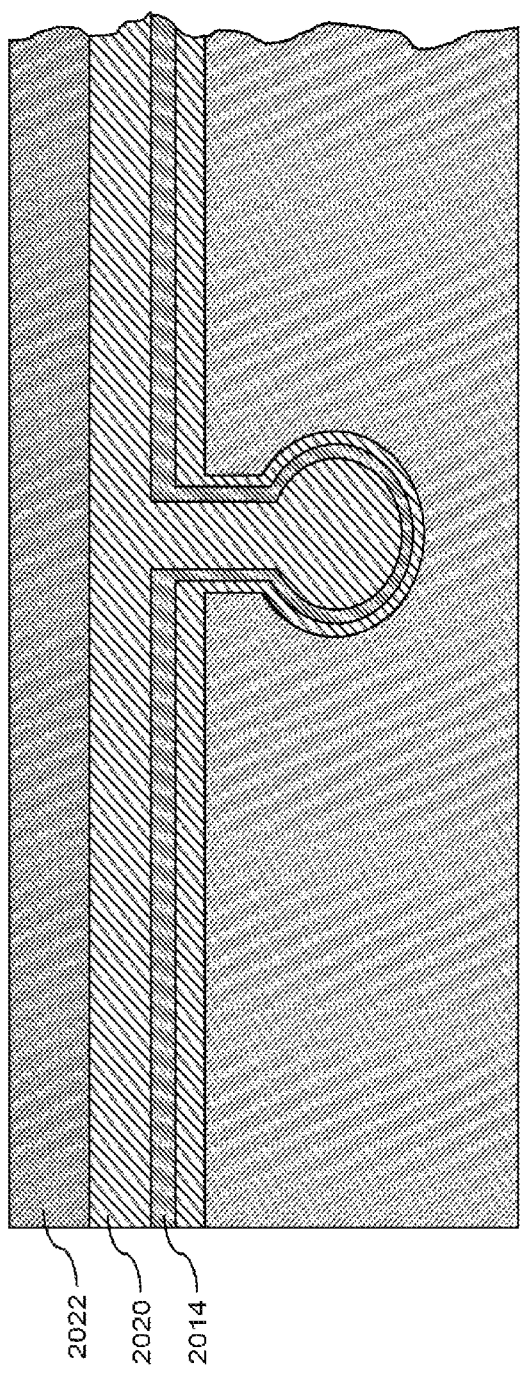

The membrane sacrificial layer 2020 can additionally serve as a support for forming a reference electrode 2022. The latter can be formed by depositing a layer composed of an electrically conductive material, for instance composed of a metal or a polycrystalline semiconductor material, e.g. silicon (FIG. 29). Alternatively, the reference electrode can be formed by depositing a layer stack comprising an electrically conductive reference electrode layer, followed by an electrically insulating reference electrode layer and a further electrically conductive reference electrode layer, in order to obtain a reference electrode in accordance with FIG. 1b.

Figure 30:
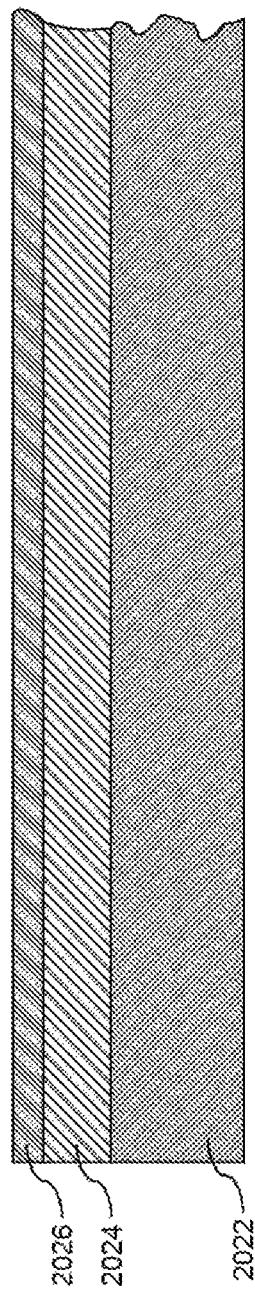

Afterward, as shown in FIG. 30, a reference electrode sacrificial layer 2024, for example composed of an electrically insulated material, for example an oxide, for instance SiOx, can be applied on the reference electrode 2022 and a second membrane material layer 2026 can be applied on the reference electrode sacrificial layer 2024. The second membrane material layer 2026 can be formed for example from an electrically conductive material, for instance from a metal or a polycrystalline semiconductor material, e.g. silicon. In FIG. 30 and also in the subsequent FIGS. 31 to 38, for reasons of simplicity, only the reference electrode 2022 from FIG. 29 is shown, while the other layers are not illustrated for reasons of simplicity, but are present.

Figure 31:
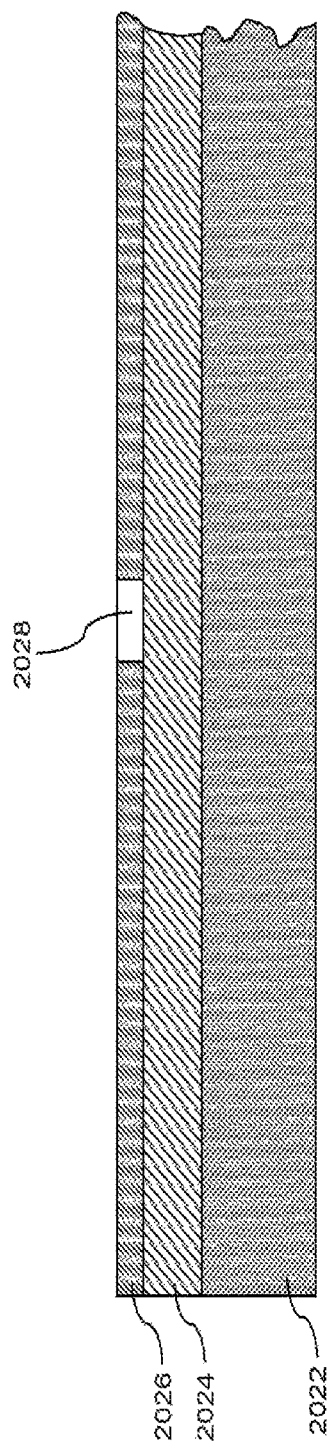
Figure 32:
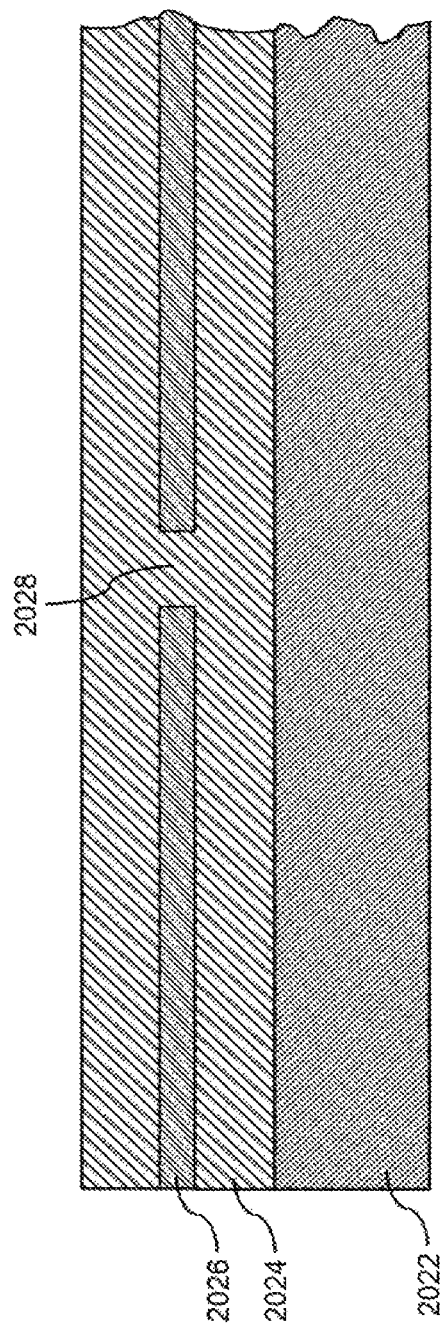

Afterward, as shown in FIG. 31, a through opening 2028 can be formed in the second membrane material layer 2026, for example by etching, said through opening exposing the reference electrode sacrificial layer 2024. Subsequently, as shown in FIG. 32, a further sacrificial material layer can be applied on the second membrane material layer 2026 and also, through the through opening 2028, on the reference electrode sacrificial layer 2024. Said further sacrificial material layer can be formed from the same material as the reference electrode sacrificial layer 2024, as a result of which an integral sacrificial layer is formed, which will also be referred to as reference electrode layer and provided with the reference sign 2024 hereinafter.

Figure 33:
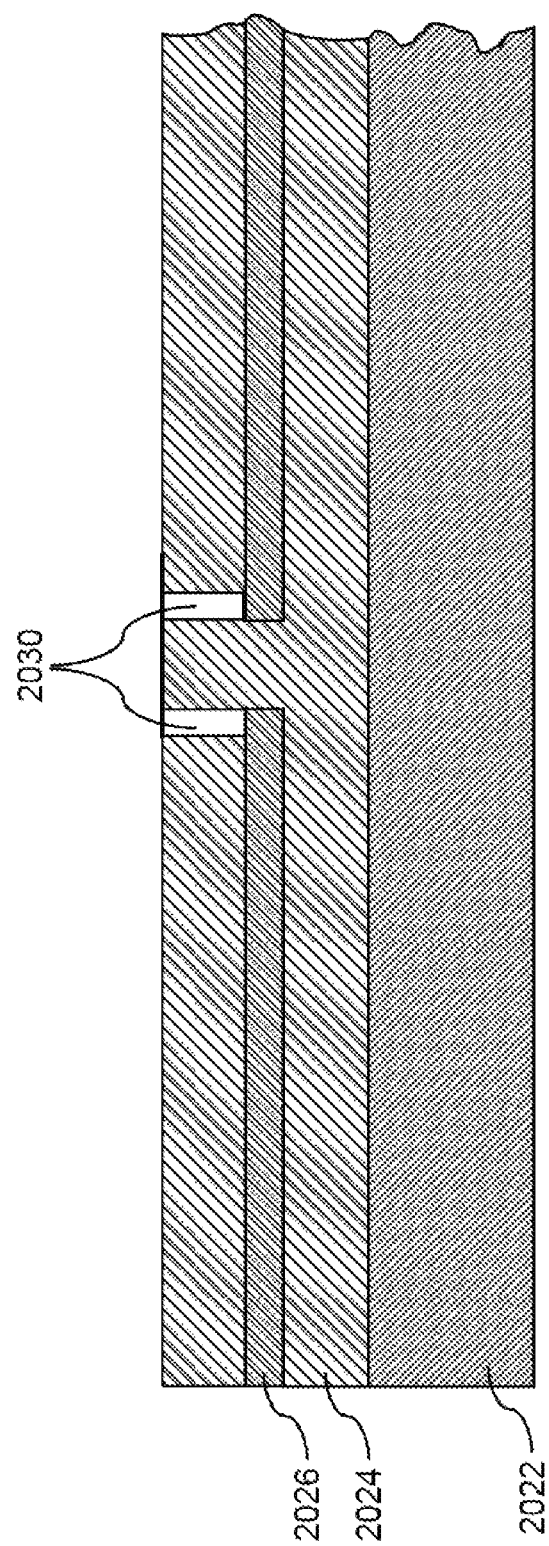
Figure 34:
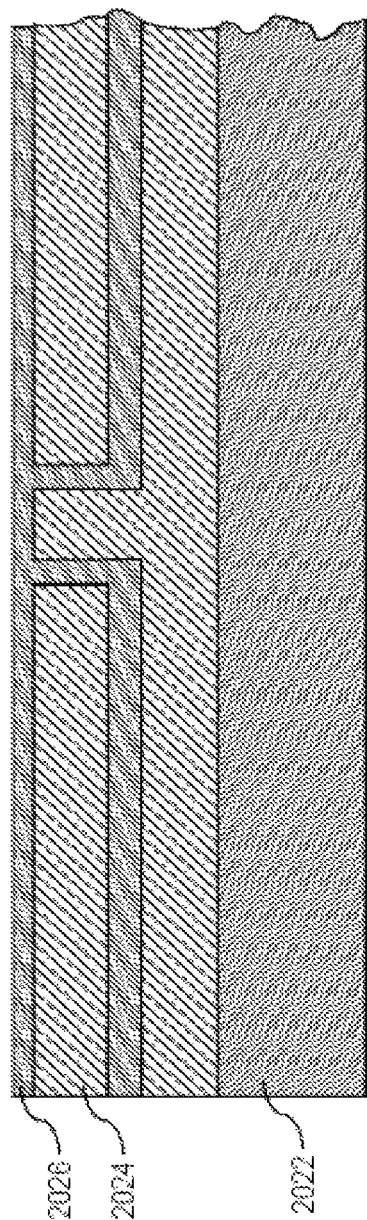

Openings 2030 can then be formed in the reference electrode sacrificial layer 2024, which openings expose an edge region of the second membrane material layer 2026 that delimits the through opening 2028 (FIG. 33). Afterward, as shown in FIG. 34, a further membrane material layer can be applied on the reference electrode sacrificial layer 2024 and also into the openings 2030. Said further membrane material layer can be formed integrally with the second membrane material layer 2026 through the openings 2030. Therefore, the integral membrane material layer formed thereby is also referred to as second membrane material layer and provided with the reference sign 2026.

Figure 35:
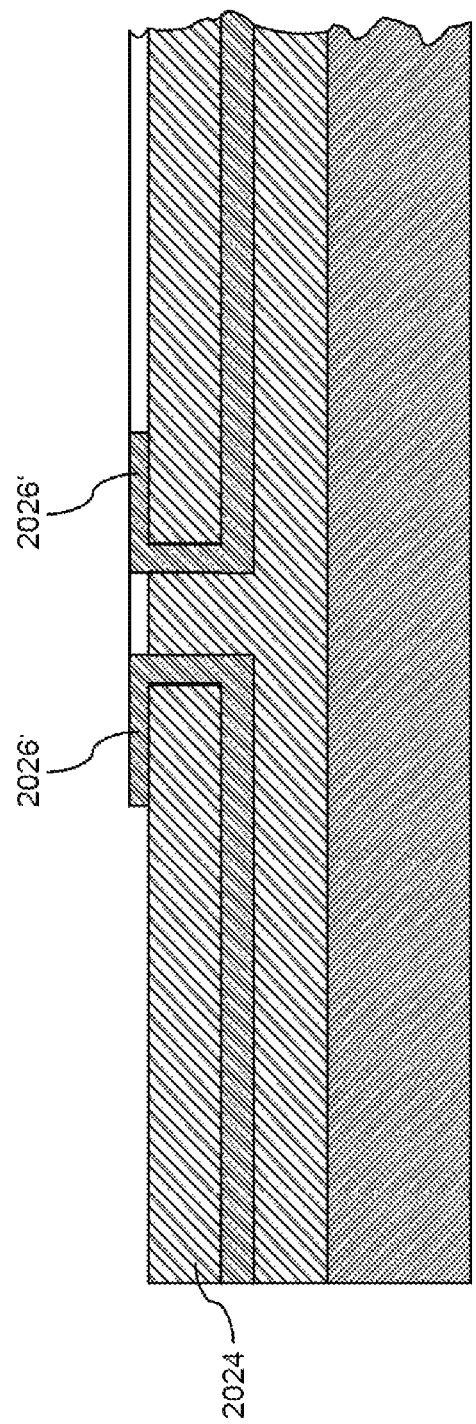
Figure 36:
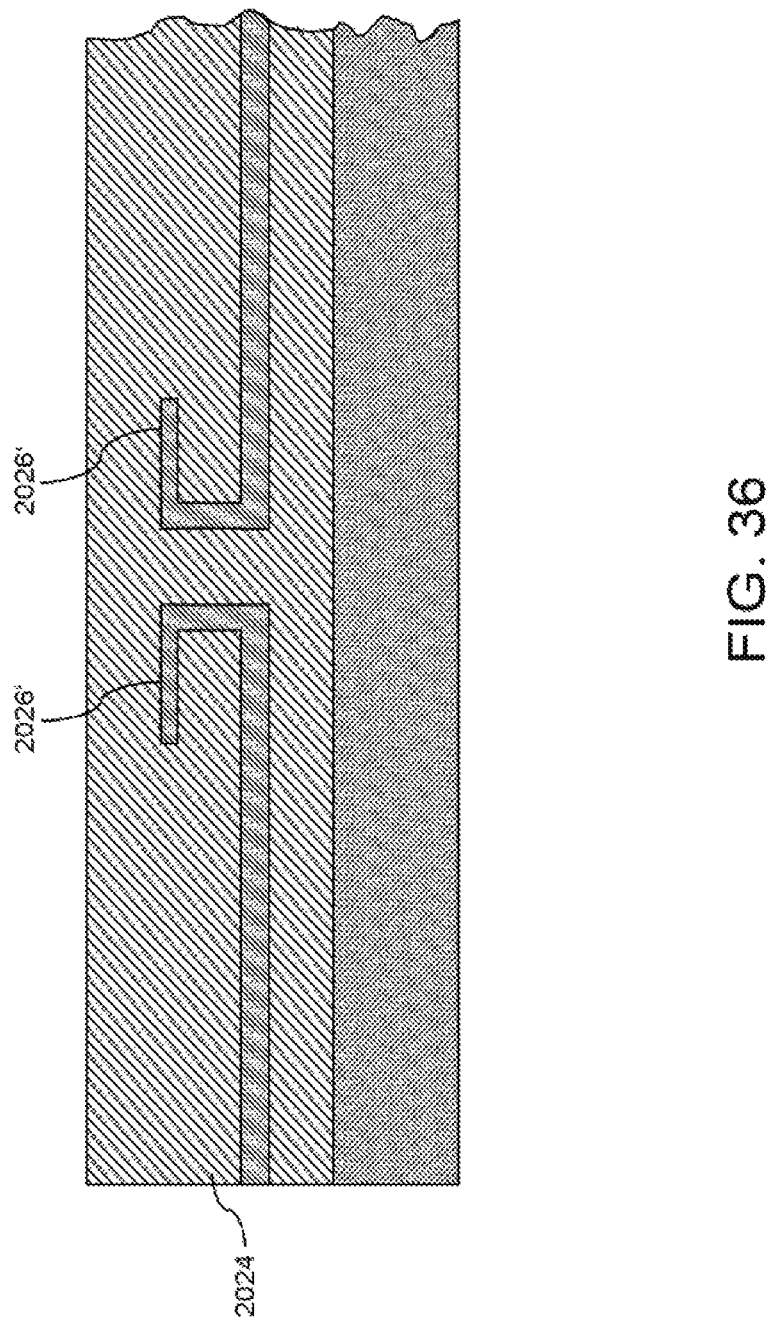
Figure 37:
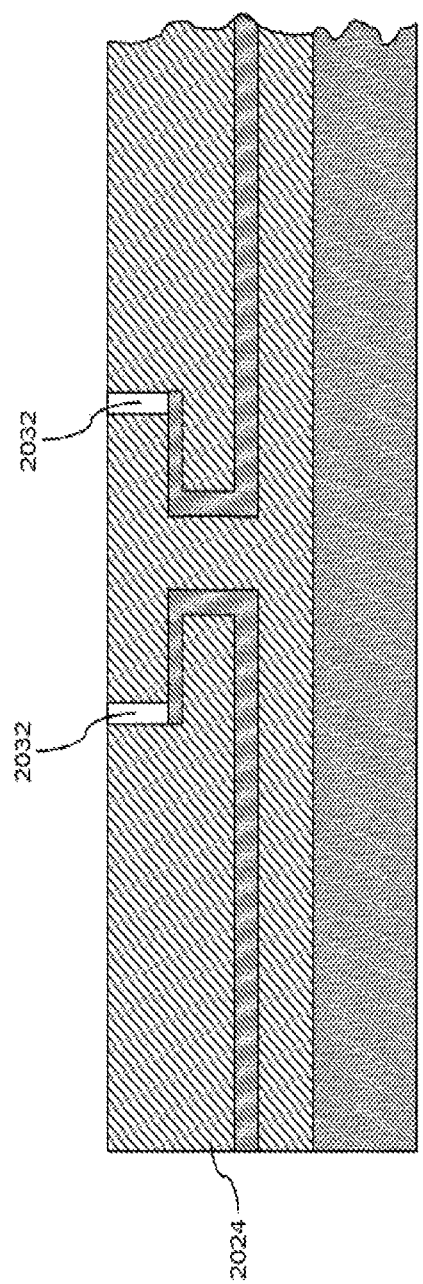
Figure 38:
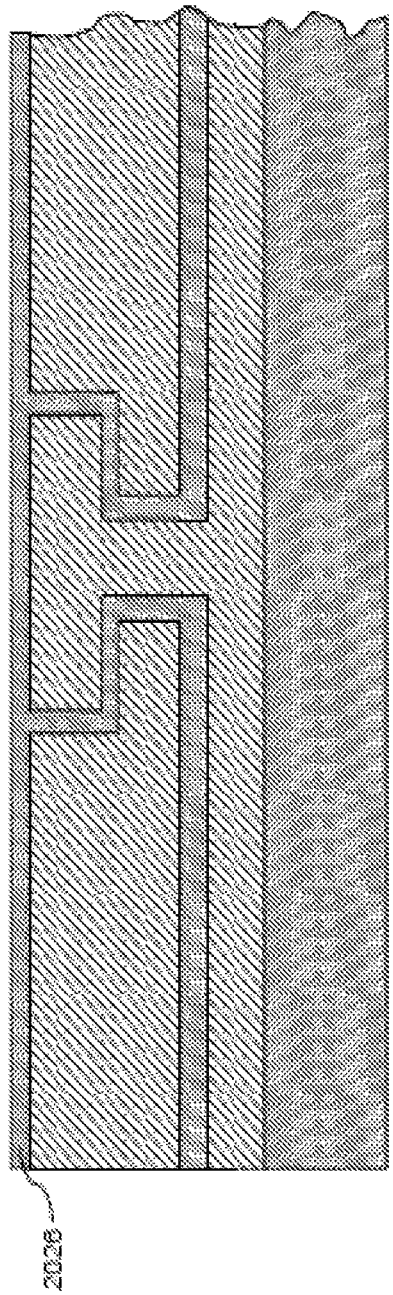
Figure 39:
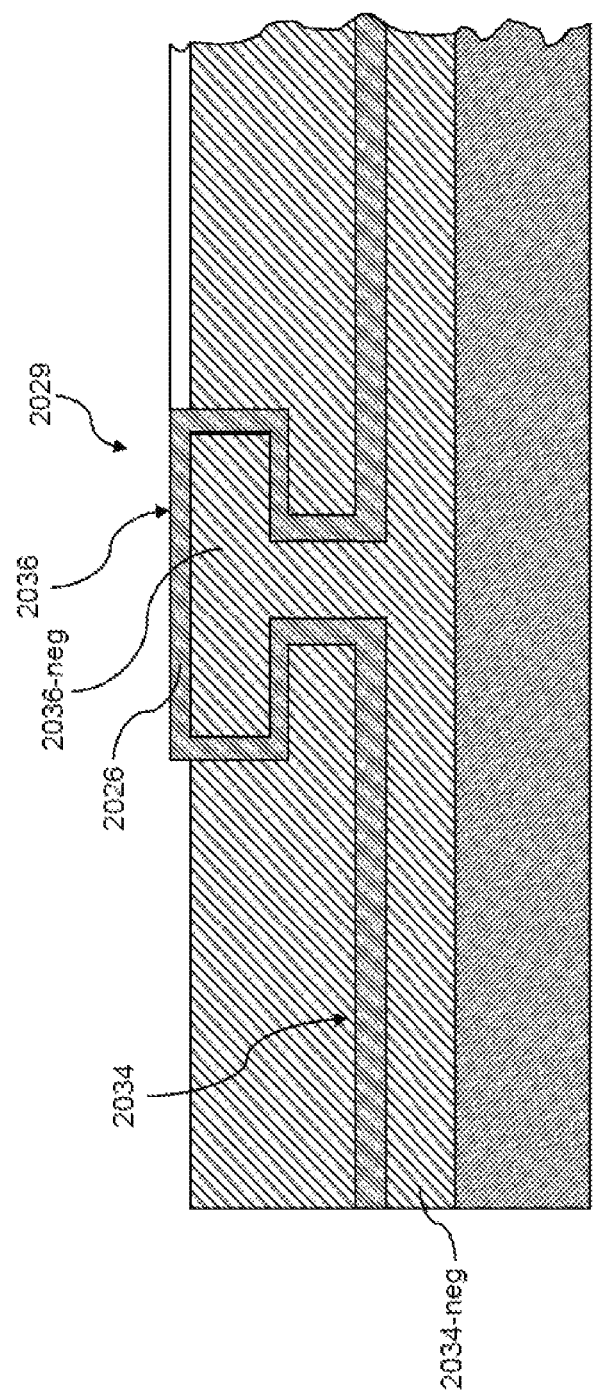

The second membrane material layer 2026 can subsequently be structured, as shown in FIG. 35, as a result of which thin webs 2026' composed of membrane material are formed at the surface of the reference electrode sacrificial layer 2024. As shown in FIG. 36, the reference electrode sacrificial layer 2024 can then be continued in the thickness direction by depositing further sacrificial material in such a way that it covers the webs 2026'. Openings 2032 can then be formed in the reference electrode sacrificial layer 2024 continued in the thickness direction, for instance by etching, which openings expose an edge region of the webs 2026' (FIG. 37). Afterward, as shown in FIG. 38, a further layer of membrane material can be deposited onto the reference electrode sacrificial layer 2024 and also into the openings 2032, as a result of which a new integral membrane material layer 2026 is formed, from which a second membrane 2026 can be formed by subsequent structuring (FIG. 39). As shown in FIG. 39, the second membrane 2026 comprises a region 2029 displaceable by sound and having a planar section 2034 and also an undulatory section 2036. The reference electrode sacrificial layer 2024 thus serves as a negative mold for forming the second membrane 2026. The negative mold comprises a first section 2034-neg having a shape complementary to the planar section 2034 of the region 2029 of the second membrane 2026 that is displaceable by sound, and also a second section 2036-neg having a shape complementary to the undulatory section 2036 of the region 2029 of the second membrane 2026 that is displaceable by sound. As described above, regions of the second section 2036-neg of the negative mold are formed after the formation of regions of the second membrane 2026. As a result, it is possible to form a negative mold having a second section having a complex construction. Accordingly, with such a negative mold it is possible to form a membrane having an undulatory section whose shape can be individually adapted to the stress conditions in the relevant membrane.

Figure 40:
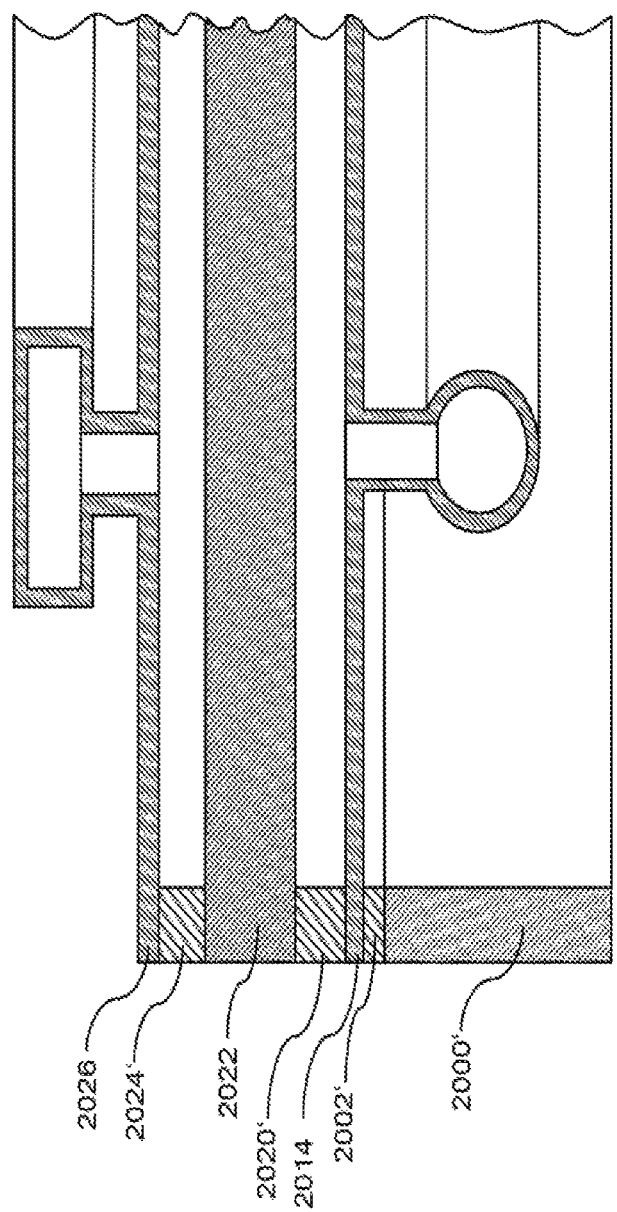

Afterward, as shown in FIG. 40, a part of the substrate 2000, of the sacrificial layer 2002, of the membrane sacrificial layer 2020 and of the reference electrode sacrificial layer 2024 can be removed. The first membrane 2014, the reference electrode 2022 and also the second membrane 2026 can be exposed as a result. By etching only a part of the substrate 2000, it is possible to form a holder 2000' from the substrate 2000. By etching only a part of the sacrificial layer 2002, of the membrane sacrificial layer 2020 and of the reference electrode sacrificial layer 2024, it is possible to form a supporting element 2002' between the holder 2000' and the first membrane 2014, a supporting element 2020' between the first membrane 2014 and the reference electrode 2022, and respectively a supporting element 2024' between the reference electrode 2022 and the second membrane 2026.

Even though this is not shown explicitly in the figures, the method can furthermore comprise forming at least one through opening in the reference electrode 2022 and also a spacer extending through the through opening in the reference electrode 2022. The spacer can be connected to the first membrane 2014 or/and the second membrane 2026.

Figure 41:
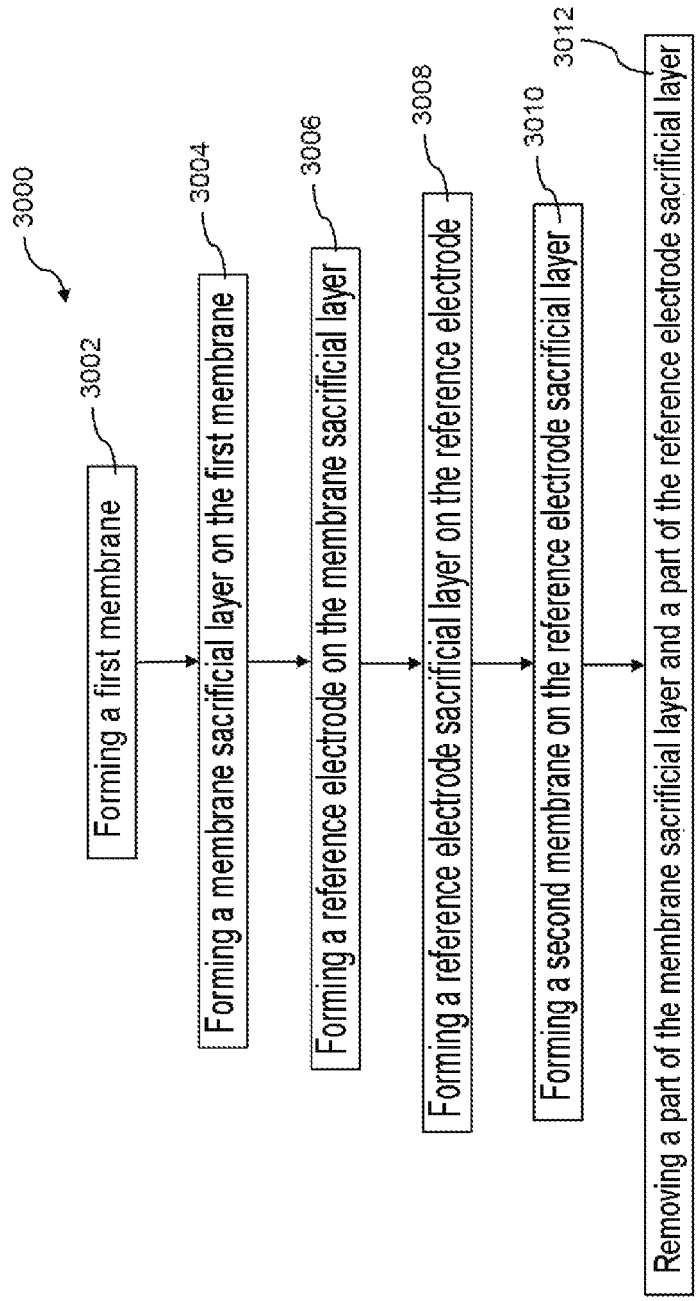
FIG. 41 shows a flow diagram of one exemplary method for producing a microelectromechanical microphone.

FIG. 41 shows a flow diagram of one exemplary method 3000 for producing a microelectromechanical microphone. Said method can comprise:

forming a first membrane (3002), forming a membrane sacrificial layer on the first membrane (3004), forming a reference electrode on the membrane sacrificial layer (3006), forming a reference electrode sacrificial layer on the reference electrode (3008), forming a second membrane on the reference electrode sacrificial layer (3010), and removing a part of the membrane sacrificial layer and a part of the reference electrode sacrificial layer (3012).

Figure 42:
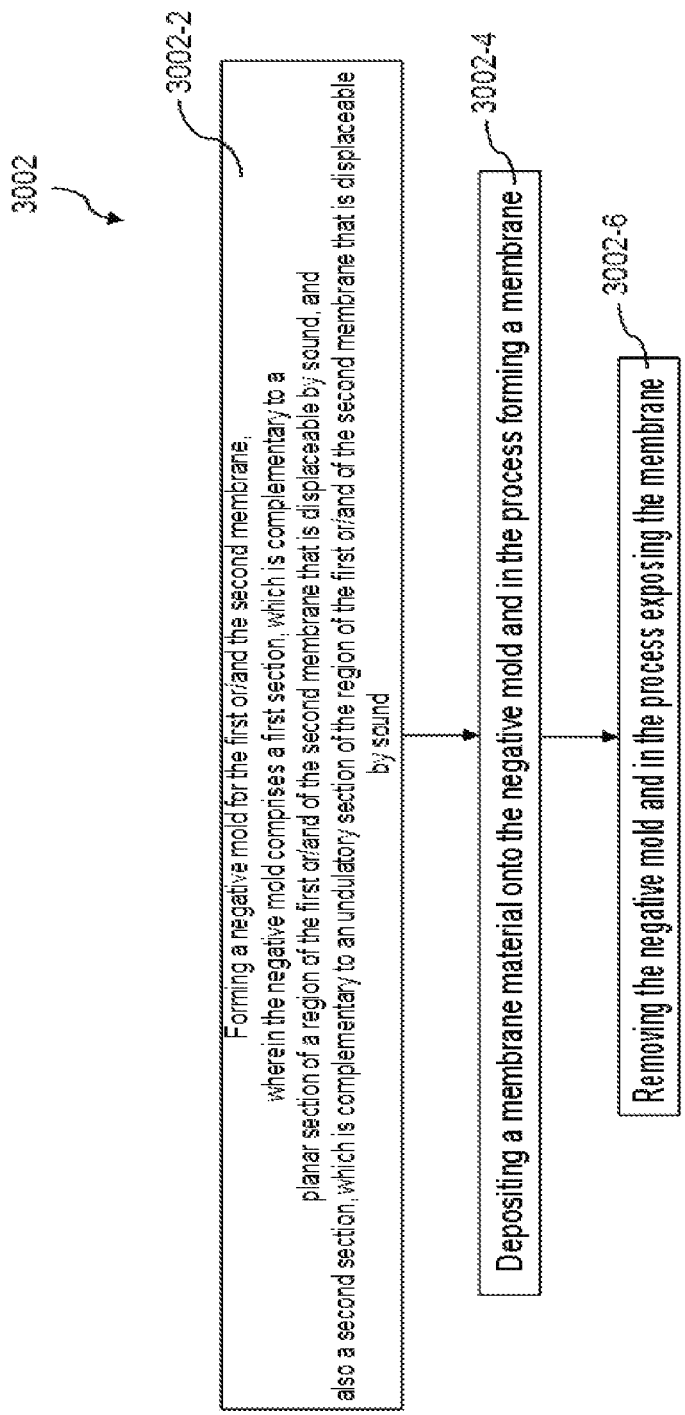
FIG. 42 shows a flow diagram of one exemplary method for producing a membrane of a microelectromechanical microphone.

FIG. 42 shows a flow diagram of one exemplary method 3002 for producing the first or/and the second membrane. The method 3002 can comprise:

forming a negative mold for the first or/and the second membrane, wherein the negative mold comprises a first section, which is complementary to a planar section of a region of the first or/and of the second membrane that is displaceable by sound, and also a second section, which is complementary to an undulatory section of the region of the first or/and of the second membrane that is displaceable by sound (3002-2), depositing a membrane material onto the negative mold and in the process forming a membrane (3002-4), and removing the negative mold and in the process exposing the membrane (3002-6).

Numerous exemplary microelectromechanical microphones are described below.

Example 1 is a microelectromechanical microphone which can comprise: a reference electrode, a first membrane arranged on a first side of the reference electrode and displaceable by sound to be detected, and a second membrane arranged on a second side of the reference electrode, said second side being situated opposite the first side of the reference electrode, and displaceable by sound to be detected. A region of one from the first and second membranes that is displaceable by sound relative to the reference electrode, independently of said region's position relative to the reference electrode, can comprise a planar section and also an undulatory section adjoining the planar section and arranged in a region of overlap of the one membrane with the other from the first and second membranes.

In example 2, the subject matter of example 1 can optionally furthermore comprise the fact that a region of the first membrane that is displaceable by sound relative to the reference electrode comprises a planar section and also an undulatory section adjoining the planar section and arranged in a region of overlap with the second membrane, and that a region of the second membrane that is displaceable by sound relative to the reference electrode comprises a planar section and also an undulatory section adjoining the planar section and arranged in a region of overlap with the first membrane.

In example 3, the subject matter of example 1 can optionally furthermore comprise the fact that a region of only a single one from the first and second membranes that is displaceable by sound relative to the reference electrode comprises an undulatory section, and a region of the other from the first and second membranes that is displaceable by sound relative to the reference electrode is embodied as substantially completely planar.

In example 4, the subject matter of any of examples 1 to 3 can optionally furthermore comprise the fact that the undulatory section is delimited by the planar section on all sides.

In example 5, the subject matter of any of examples 1 to 4 can optionally furthermore comprise the fact that the undulatory section has a ring-segment-like or ring-shaped configuration.

In example 6, the subject matter of any of examples 1 to 5 can optionally furthermore comprise the fact that the undulatory section comprises a hollow projection protruding from the planar section, which protrudes from the planar section in a direction facing toward the reference electrode or in a direction facing away from the reference electrode. The undulatory section can optionally comprise a plurality of hollow projections protruding from the planar section, which protrude in a direction facing toward the reference electrode or/and in a direction facing away from the reference electrode.

In example 7, the subject matter of example 6 can optionally furthermore comprise the fact that the hollow projection or the hollow projections has or have at least in sections a rectangular, optionally square, cross section or/and an elliptic, optionally circular, cross section or/and an angular cross section.

In example 8, the subject matter of any of examples 1 to 7 can optionally furthermore comprise the fact that the first membrane comprises at least one membrane anti-stick projection facing the reference electrode, optionally a plurality of membrane anti-stick projections facing the reference electrode, or/and that the second membrane comprises at least one membrane anti-stick projection facing the reference electrode, optionally a plurality of membrane anti-stick projections facing the reference electrode.

In example 9, the subject matter of either of examples 6 and 7 and of example 8 can optionally furthermore comprise the fact that at least one membrane anti-stick projection is provided on a hollow projection protruding in the direction of the reference electrode.

In example 10, the subject matter of any of examples 1 to 9 can optionally furthermore comprise the fact that the reference electrode comprises at least one electrode anti-stick projection protruding toward the first membrane or/and at least one electrode anti-stick projection protruding toward the second membrane.

In example 11, the subject matter of any of examples 1 to 10 can optionally furthermore comprise at least one spacer which is arranged between the first and second membranes and which is configured to maintain a predefined distance between the first and second membranes, wherein the reference electrode comprises at least one through opening through which at least one spacer extends.

In example 12, the subject matter of example 11 can optionally furthermore comprise the fact that at least one spacer is permanently, optionally integrally, connected to the first or/and the second membrane.

In example 13, the subject matter of examples 2 and 12 can optionally furthermore comprise the fact that at least one spacer is connected to the planar section of the region of the first membrane that is displaceable by sound, and to the planar section of the region of the second membrane that is displaceable by sound.

In example 14, the subject matter of examples 6 and 13 can optionally furthermore comprise the fact that the undulatory section of the region of the first membrane that is displaceable by sound comprises a plurality of hollow projections, wherein at least one spacer is connected to a part of the planar section of the region of the first membrane that is displaceable by sound between two hollow projections or/and that the undulatory section of the region of the second membrane that is displaceable by sound comprises a plurality of hollow projections, wherein at least one spacer is connected to a part of the planar section of the region of the second membrane that is displaceable by sound between two hollow projections.

In example 15, the subject matter of examples 2 and 12 can optionally furthermore comprise the fact that at least one spacer is connected to the undulatory section of the region of the first membrane that is displaceable by sound or/and to the undulatory section of the region of the second membrane that is displaceable by sound.

In example 16, the subject matter of any of examples 11 to 15 can optionally furthermore comprise the fact that at least one spacer extends without contact through a through opening in at least one position of the first or/and of the second membrane, optionally in all positions of the first or/and of the second membrane.

In example 17, the subject matter of any of examples 11 to 16 can optionally comprise a plurality of spacers between the first and second membranes.

In example 18, the subject matter of any of examples 11 to 17 can optionally furthermore comprise the fact that at least one spacer, optionally a plurality of spacers, further optionally each spacer, at least in sections, optionally completely, is formed from an electrically insulating material.

In example 19, the subject matter of any of examples 11 to 18 can optionally furthermore comprise the fact that at least one spacer, optionally a plurality of spacers, further optionally each spacer, at least in sections, optionally completely, is formed from an electrically conductive material.

In example 20, the subject matter of any of examples 17 to 19 can optionally furthermore comprise the fact that the reference electrode comprises a plurality of through openings through which a respective spacer extends.

In example 21, the subject matter of any of examples 1 to 20 can optionally furthermore comprise the fact that the first and second membranes are electrically insulated from one another, optionally are electrically insulated from one another in each of their positions relative to the reference electrode.

In example 22, the subject matter of any of examples 1 to 20 can optionally furthermore comprise the fact that the first and second membranes are electrically connected to one another, optionally are electrically connected to one another in each of their positions relative to the reference electrode.

In example 23, the subject matter of examples 19 and 22 can optionally furthermore comprise the fact that the first and second membranes are electrically connected to one another by at least one spacer, optionally by a plurality of spacers, further optionally by all spacers.

In example 24, the subject matter of any of examples 1 to 23 can optionally furthermore comprise the fact that the reference electrode is formed completely from an electrically conductive material.

In example 25, the subject matter of any of examples 1 to 23 can optionally furthermore comprise the fact that the reference electrode comprises: an electrically conductive first reference electrode layer facing the first membrane, an electrically conductive second reference electrode layer facing the second membrane, and an electrically insulating third reference electrode layer arranged between the first and second reference electrode layers and configured to electrically insulate the first reference electrode layer from the second reference electrode layer.

In example 26, the subject matter of any of examples 1 to 25 can optionally furthermore comprise the fact that the first membrane comprises a dynamic section contained at least partly, optionally completely, in its region displaceable by sound, said dynamic section being electrically insulated from a remaining region of the first membrane by an insulation section, or/and that the second membrane comprises a dynamic section contained at least partly, optionally completely, in its region displaceable by sound, said dynamic section being electrically insulated from a remaining region of the second membrane by an insulation section.

In example 27, the subject matter of any of examples 1 to 26 can optionally furthermore comprise a holder to which the first membrane or/and the second membrane or/and the reference electrode is/are secured.

In example 28, the subject matter of examples 26 and 27 can optionally furthermore comprise the fact that the remaining region of the first membrane comprises a securing section connected to the holder, or/and that the remaining region of the second membrane comprises a securing section connected to the holder.

In example 29, the subject matter of example 28 can optionally furthermore comprise the fact that the insulation section of the first membrane is provided at least partly, optionally completely, on a side of the undulatory section of the first membrane that faces the securing section of the first membrane or/and on a side of said undulatory section that faces away from the securing section of the first membrane, or/and that the insulation section of the second membrane is arranged at least partly, optionally completely, on a side of the undulatory section of the second membrane that faces the securing section of the second membrane or/and on a side of said undulatory section that faces away from the securing section of the second membrane.

In example 30, the subject matter of any of examples 1 to 29 can optionally furthermore comprise the fact that a gas pressure that is lower than the normal pressure is present in a space defined between the first and second membranes, in which space the reference electrode is arranged.

Example 31 is a method for operating a microelectromechanical microphone according to any of examples 1 to 30, comprising: reading out a first electrical signal from the microphone, which characterizes a sound-governed displacement of the first membrane relative to the reference electrode, reading out a second electrical signal from the microphone, which characterizes a sound-governed displacement of the second membrane relative to the reference electrode, combining the first and second electrical signals in order to determine properties of the sound by which the first and second membranes are displaceable.

In example 32, the subject matter of example 31 can optionally furthermore comprise the fact that the first electrical signal is an electrical voltage or an electric current or/and that the second electrical signal is an electrical voltage or an electric current.

In example 33, the subject matter of example 31 or 32 can optionally furthermore comprise the fact that combining the first and second electrical signals comprises: adding the first and second electrical signals or/and subtracting the first electrical signal from the second electrical signal or subtracting the second electrical signal from the first electrical signal.

Example 34 is a method for producing a microelectromechanical microphone according to any of examples 1 to 30. The method can comprise: producing a first membrane, producing a reference electrode on the first membrane, and producing a second membrane on the reference electrode. Producing the first or/and the second membrane can comprise: producing a negative mold for the first or/and the second membrane, wherein the negative mold comprises a first section complementary to a planar section of a region of the first or/and of the second membrane that is displaceable by sound, and also a second section complementary to an undulatory section of the region of the first or/and of the second membrane that is displaceable by sound, depositing a membrane material onto the negative mold and in the process forming the first or the second membrane, and removing the negative mold and in the process exposing the first or the second membrane.

In example 35, the subject matter of example 34 can optionally furthermore comprise the fact that the second section of the negative mold comprises a projection or/and a cutout.

In example 36, the subject matter of example 35 can optionally furthermore comprise the fact that the second section of the negative mold comprises a cutout or is embodied as a cutout. Producing the cutout can comprise: forming a first cavity in a substrate, depositing a protective layer onto the walls of the first cavity, forming an opening in the protective layer and in the process exposing the substrate, forming a second cavity, connected to the first cavity, in the substrate through the opening in the protective layer, and removing the protective layer.

In example 37, the subject matter of example 36 can optionally furthermore comprise the fact that the membrane material is deposited into the cutout as a layer which covers the inner walls of the cutout and which defines a hollow space accessible from outside the substrate.

In example 38, the subject matter of any of examples 35 to 37 can optionally furthermore comprise the fact that the second section comprises a projection or is embodied as a projection. Regions of the projection can be formed after the process of producing sections of the first and/or the second membrane.

In example 39, the subject matter of example 38 can optionally furthermore comprise: depositing a first membrane material layer onto a first sacrificial layer, forming a through opening in the first membrane material layer, depositing a second sacrificial layer onto the membrane material layer and also into the through opening formed in the membrane material layer, forming an opening in the second sacrificial layer, which exposes an edge region of the first membrane material layer that delimits the through opening in the first membrane material layer, and depositing a second membrane material layer onto the second sacrificial layer and also into the opening formed in the second sacrificial layer.

In example 40, the subject matter of example 39 can optionally furthermore comprise: structuring the second membrane material layer and in the process forming a web-shaped section composed of membrane material which is connected to the first membrane material layer via the opening formed in the second sacrificial layer, depositing a third sacrificial layer onto the web and also onto the second sacrificial layer, forming an opening in the third sacrificial layer or in the second and third sacrificial layers, which opening exposes an edge region of the web, and depositing a third membrane material layer onto the third sacrificial layer and also into the opening formed in the third sacrificial layer or in the second and third sacrificial layers.

In example 41, the subject matter of example 40 can optionally furthermore comprise the fact that removing the negative mold comprises removing the first to third sacrificial layers.

In example 42, the subject matter of any of examples 34 to 41 can optionally furthermore comprise: forming a membrane sacrificial layer on the first membrane, wherein the reference electrode is formed on the membrane sacrificial layer.

In example 43, the subject matter of any of examples 34 to 42 can optionally furthermore comprise: forming a reference electrode sacrificial layer on the reference electrode, wherein the second membrane is formed on the reference electrode sacrificial layer.

In example 44, the subject matter of any of examples 34 to 43 can optionally furthermore comprise: forming at least one through opening in the reference electrode and forming a spacer extending through the through opening between the first and second membranes, wherein optionally the spacer is connected to the first or/and the second membrane.

What is claimed is:

1. A microelectromechanical microphone, comprising:
    a reference electrode,
    a first membrane arranged on a first side of the reference electrode and displaceable by sound to be detected, and
    a second membrane arranged on a second side of the reference electrode, said second side being situated opposite the first side of the reference electrode, and displaceable by sound to be detected,
    wherein a region of the first membrane that is displaceable by sound relative to the reference electrode comprises a planar section and an undulatory section adjoining the planar section, wherein the planar section and the undulatory section of the first membrane is arranged opposite from the reference electrode and the second membrane, and wherein a distance between the undulatory section and the reference electrode varies according to a topology of the undulatory section, and wherein the first membrane comprises a dynamic section contained at least partly in its region displaceable by sound, said dynamic section being electrically insulated from a remaining region of the first membrane by an insulation section, or the second membrane comprises a dynamic section contained at least partly in its region displaceable by sound, said dynamic section being electrically insulated from a remaining region of the second membrane by an insulation section.

2. The microelectromechanical microphone as claimed in claim 1,
wherein a region of the second membrane that is displaceable by sound relative to the reference electrode comprises a planar section and an undulatory section adjoining the planar section, wherein the planar section and the undulatory section of the second membrane is arranged opposite from the reference electrode and the first membrane.

3. The microelectromechanical microphone as claimed in claim 1, wherein only the first membrane comprises the planar and undulatory sections.

4. The microelectromechanical microphone as claimed in claim 1, wherein the undulatory section is delimited by the planar section on all sides.

5. The microelectromechanical microphone as claimed in claim 1, wherein the undulatory section comprises a hollow projection protruding from the planar section, which protrudes from the planar section in a direction facing toward the reference electrode or in a direction facing away from the reference electrode.

6. The microelectromechanical microphone as claimed in claim 1, further comprising at least one spacer arranged between the first and second membranes and configured to maintain a predefined distance between the first and second membranes, wherein the reference electrode comprises at least one through opening through which at least one spacer extends, and wherein at least one spacer is permanently and integrally connected to the first membrane or/and the second membrane.

7. The microelectromechanical microphone as claimed in claim 6, wherein the at least one spacer is formed from an electrically insulating material.

8. The microelectromechanical microphone as claimed in claim 6, wherein the at least one spacer is formed from an electrically conductive material.

9. The microelectromechanical microphone as claimed in claim 1, wherein the first and second membranes are electrically insulated from one another.

10. The microelectromechanical microphone as claimed in claim 1, wherein the first and second membranes are electrically connected to one another.

11. The microelectromechanical microphone as claimed in claim 1, wherein the first and second membranes are electrically connected to one another by at least one spacer.

12. The microelectromechanical microphone as claimed in claim 1, wherein the reference electrode is formed completely from an electrically conductive material.

13. The microelectromechanical microphone as claimed in claim 1, wherein the reference electrode comprises:
an electrically conductive first reference electrode layer facing the first membrane,
an electrically conductive second reference electrode layer facing the second membrane, and
an electrically insulating third reference electrode layer arranged between the first and second reference electrode layers and configured to electrically insulate the first reference electrode layer from the second reference electrode layer.

14. The microelectromechanical microphone as claimed in claim 1, further comprising a holder to which the first membrane or/and the second membrane or/and the reference electrode is/are secured.

15. The microelectromechanical microphone as claimed in claim 14, wherein the remaining region of the first membrane comprises a securing section connected to the holder, or/and wherein the remaining region of the second membrane comprises a securing section connected to the holder.

16. The microelectromechanical microphone as claimed in claim 15,
wherein the insulation section of the first membrane is arranged at least partly on a side of the undulatory section of the first membrane that faces the securing section of the first membrane or/and on a side of said undulatory section that faces away from the securing section of the first membrane, or/and
wherein the insulation section of the second membrane is arranged at least partly on a side of the undulatory section of the second membrane that faces the securing section of the second membrane or/and on a side of said undulatory section that faces away from the securing section of the second membrane.

17. A method for operating a microelectromechanical microphone comprising a reference electrode, a first membrane arranged on a first side of the reference electrode and displaceable by sound to be detected, and a second membrane arranged on a second side of the reference electrode, said second side being situated opposite the first side of the reference electrode, and displaceable by sound to be detected, wherein a region of o the first membrane that is displaceable by sound relative to the reference electrode comprises a planar section and an undulatory section adjoining the planar section, wherein the planar section and the undulatory section of the first membrane is arranged opposite from the reference electrode and the second membrane, and wherein a distance between the undulatory sections and the reference electrode vary according to a topology of the undulatory sections, wherein the first membrane comprises a dynamic section contained at least partly in its region displaceable by sound, said dynamic section being electrically insulated from a remaining region of the first membrane by an insulation section, or the second membrane comprises a dynamic section contained at least partly in its region displaceable by sound, said dynamic section being electrically insulated from a remaining region of the second membrane by an insulation section, the method comprising:
reading out a first electrical signal from the microphone, which characterizes a sound-governed displacement of the first membrane relative to the reference electrode;
reading out a second electrical signal from the microphone, which characterizes a sound-governed displacement of the second membrane relative to the reference electrode; and
combining the first and second electrical signals in order to determine properties of the sound by which the first and second membranes are displaceable.

18. The method as claimed in claim 17, wherein combining the first and second electrical signals comprises adding or subtracting the first and second electrical signals.

19. A method for producing a microelectromechanical microphone, the method comprising:

forming a first membrane, and forming a reference electrode on the first membrane, wherein forming the first membrane comprises producing a first negative mold for the first membrane, wherein the first negative mold for the first membrane comprises a first section complementary to a planar section of a region of the first membrane that is displaceable by sound, and a second section complementary to an undulatory section of the region of the first membrane that is displaceable by sound, wherein producing the first negative mold comprises depositing a membrane material onto the first negative mold to form the first membrane, removing the first negative mold, wherein the first membrane is exposed when removing the first negative mold, forming a second membrane on the reference electrode, wherein forming the second membrane comprises producing a second negative mold for the second membrane, wherein the second negative mold for the second membrane comprises a first section complementary to a planar section of a region of the second membrane that is displaceable by sound, and a second section complementary to an undulatory section of the region of the second membrane that is displaceable by sound, wherein producing the second negative mold comprises depositing the membrane material onto the second negative mold and to form the second membrane, and removing the second negative mold, wherein the second membrane is exposed when removing the second negative mold, wherein the planar section of the first membrane is adjacent to the undulatory section of the first membrane, the planar section of the second membrane is adjacent to the undulatory section of the second membrane, the planar section and the undulatory sections of the first membrane are arranged opposite from the reference electrode and the second membrane, and the planar section and the undulatory sections of the second membrane are arranged opposite from the reference electrode and the first membrane, and wherein the first membrane comprises a dynamic section contained at least partly in its region displaceable by sound, said dynamic section being electrically insulated from a remaining region of the first membrane by an insulation section, or the second membrane comprises a dynamic section contained at least partly in its region displaceable by sound, said dynamic section being electrically insulated from a remaining region of the second membrane by an insulation section.

20. The method as claimed in claim 19, wherein the second section of the first negative mold or the second negative mold comprises a projection or a cutout.

21. The method as claimed in claim 20, wherein the second section of the first negative mold of the second negative mold comprises the cutout, and the method further comprises producing the cutout, producing the cutout comprising:

forming a first cavity in a substrate, depositing a protective layer onto walls of the first cavity, forming an opening in the protective layer to expose the substrate, forming a second cavity, connected to the first cavity, in the substrate through the opening in the protective layer, and removing the protective layer.

22. The method as claimed in claim 21, wherein the membrane material is deposited into the cutout as a layer that covers inner walls of the cutout and that defines a hollow space accessible from outside the substrate.

23. The method as claimed in claim 20, wherein the second section comprises the projection, wherein regions of the projection are formed after producing the sections of the first membrane or the second membrane.

24. The method as claimed in claim 23, further comprising:

depositing a first membrane material layer onto a first sacrificial layer, forming a through opening in the first membrane material layer, depositing a second sacrificial layer onto the first membrane material layer and also into the through opening formed in the first membrane material layer, forming an opening in the second sacrificial layer, which exposes an edge region of the first membrane material layer that delimits the through opening in the first membrane material layer, and depositing a second membrane material layer onto the second sacrificial layer and also into the opening formed in the second sacrificial layer.

* * * * *